United States Patent
Watanabe et al.

(10) Patent No.: US 8,698,279 B2
(45) Date of Patent: Apr. 15, 2014

(54) SEMICONDUCTOR DEVICE INCLUDING CAPACITOR OF INTERCONNECTION

(75) Inventors: Kenichi Watanabe, Yokohama (JP); Nobuhiro Misawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 419 days.

(21) Appl. No.: 12/958,541

(22) Filed: Dec. 2, 2010

(65) Prior Publication Data

US 2011/0133311 A1 Jun. 9, 2011

(30) Foreign Application Priority Data

Dec. 3, 2009 (JP) ................................. 2009-275622

(51) Int. Cl.
*H01L 23/528* (2006.01)
*H01L 21/283* (2006.01)

(52) U.S. Cl.
USPC ........... 257/532; 257/301; 257/306; 257/307; 257/309; 361/303

(58) Field of Classification Search
USPC .......... 257/532, E23.144, E23.153, 307, 301, 257/306, 309, 535; 438/666; 361/303
See application file for complete search history.

(56) References Cited

U.S. PATENT DOCUMENTS

| | | | |
|---|---|---|---|
| 6,582,976 B2 * | 6/2003 | Watanabe | 438/14 |
| 7,126,809 B2 * | 10/2006 | Iioka et al. | 361/306.3 |
| 7,768,055 B2 * | 8/2010 | Chinthakindi et al. | 257/307 |
| 2003/0161128 A1 * | 8/2003 | Masuda | 361/792 |
| 2004/0140487 A1 | 7/2004 | Furumiya et al. | |
| 2004/0175930 A1 * | 9/2004 | Masuda et al. | 438/628 |
| 2009/0243036 A1 * | 10/2009 | Kim | 257/532 |
| 2009/0288869 A1 * | 11/2009 | Anderson et al. | 174/261 |
| 2010/0084739 A1 | 4/2010 | Matsui | |

FOREIGN PATENT DOCUMENTS

| | | |
|---|---|---|
| JP | 2003-173013 A | 6/2003 |
| JP | 2003-249559 A | 9/2003 |
| JP | 2004-221498 A | 8/2004 |
| JP | 2004-241762 A | 8/2004 |
| JP | 2010-135515 A | 6/2010 |

OTHER PUBLICATIONS

Japanese Office Action dated Oct. 1, 2013, issued in corresponding Japanese Patent Application No. 2009-275622, w/ English translation.

* cited by examiner

*Primary Examiner* — Long K Tran
*Assistant Examiner* — Jordan Klein
(74) *Attorney, Agent, or Firm* — Westerman, Hattori, Daniels & Adrian, LLP

(57) ABSTRACT

The semiconductor device includes a capacitor including a plurality of interconnection layers stacked over each other, the plurality of interconnection layers each including a plurality of electrode patterns extended in a first direction, a plurality of via parts provided between the plurality of interconnection layers and electrically interconnecting the plurality of the electrode patterns between the interconnection layers adjacent to each other, and an insulating films formed between the plurality of interconnection layers and the plurality of via parts. Each of the plurality of via parts is laid out, offset from a center of the electrode pattern in a second direction intersecting the first direction, and the plurality of electrode patterns has a larger line width at parts where the via parts are connected to, and a distance between the electrode patterns and the adjacent electrode patterns is reduced at the parts.

9 Claims, 41 Drawing Sheets

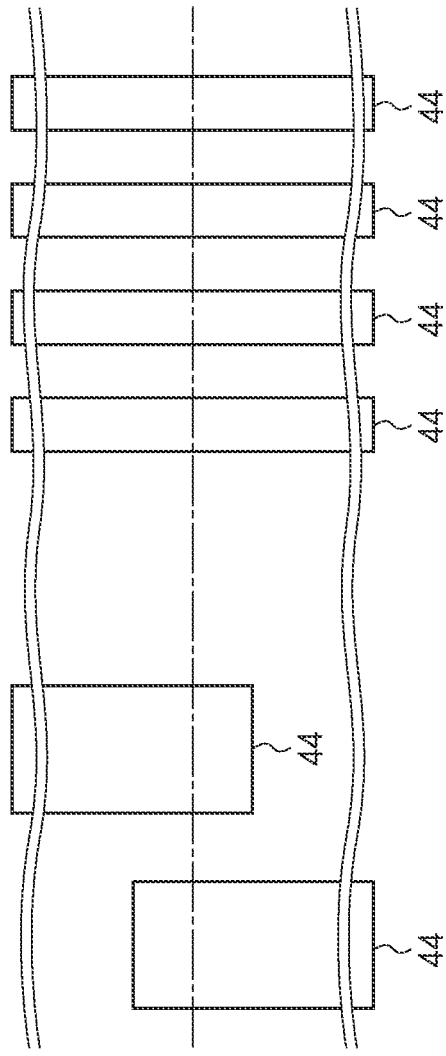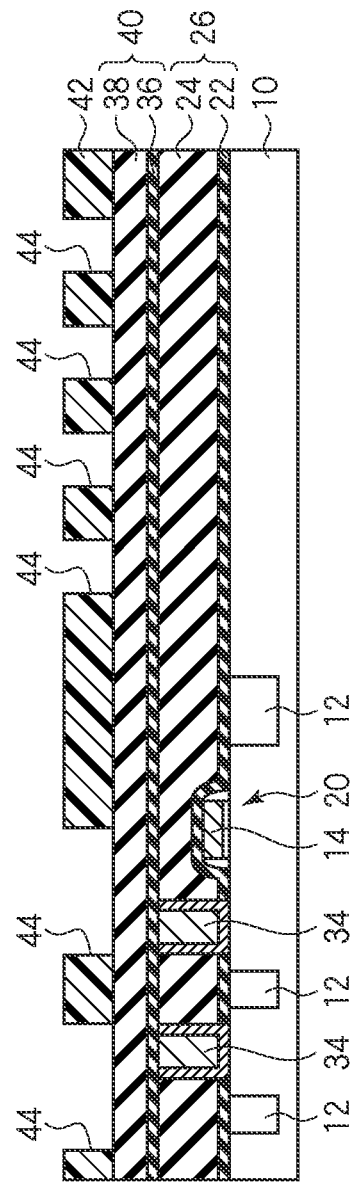
FIG. 5A
FIG. 5B

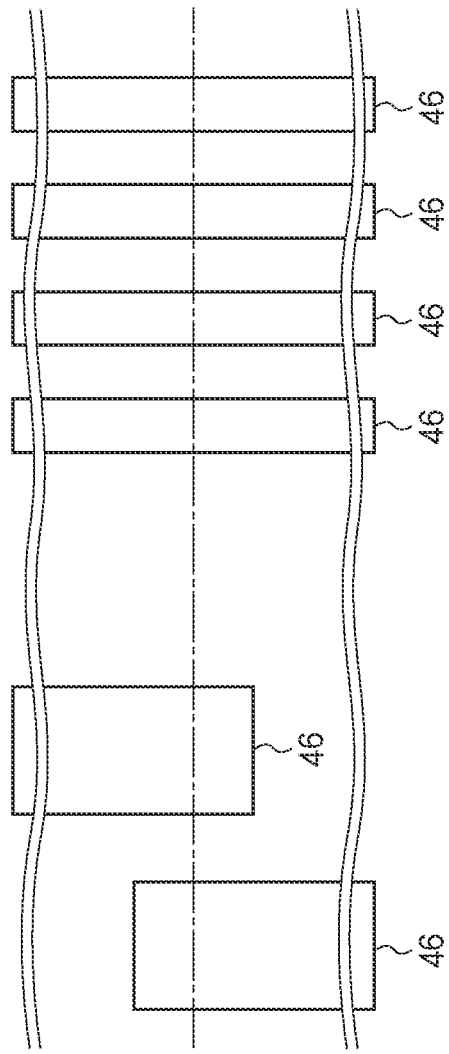
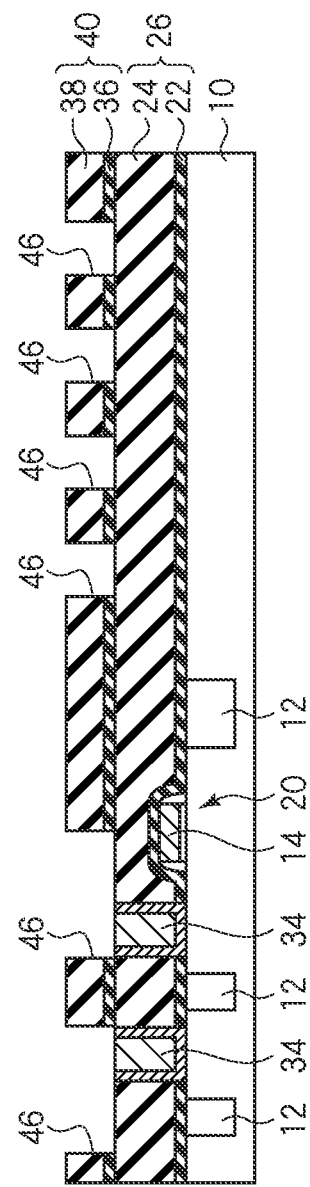
FIG. 6A
FIG. 6B

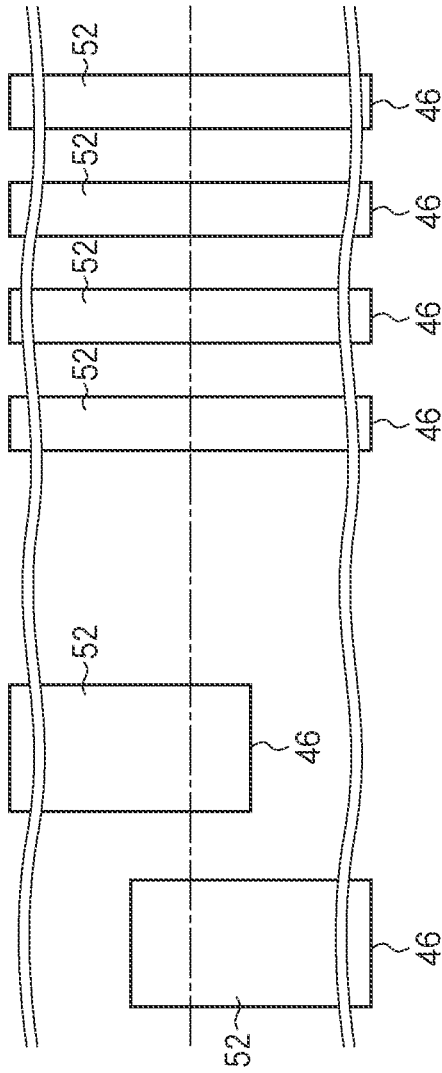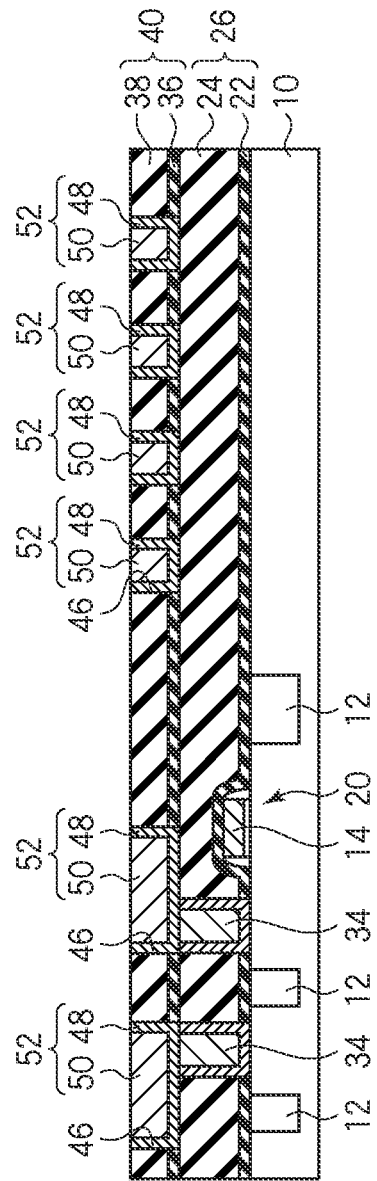
FIG. 8A
FIG. 8B

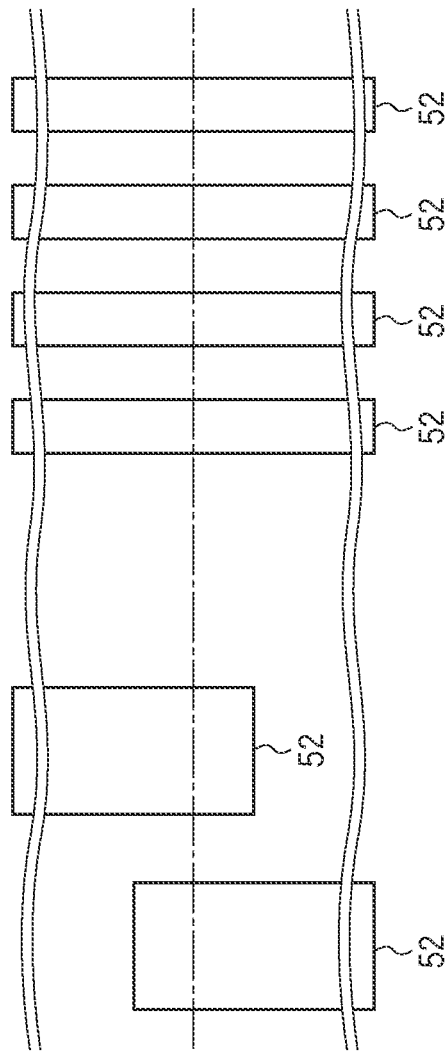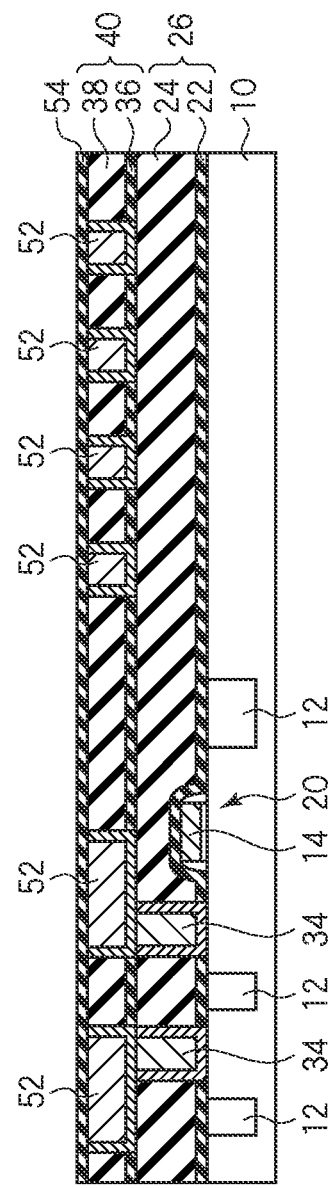

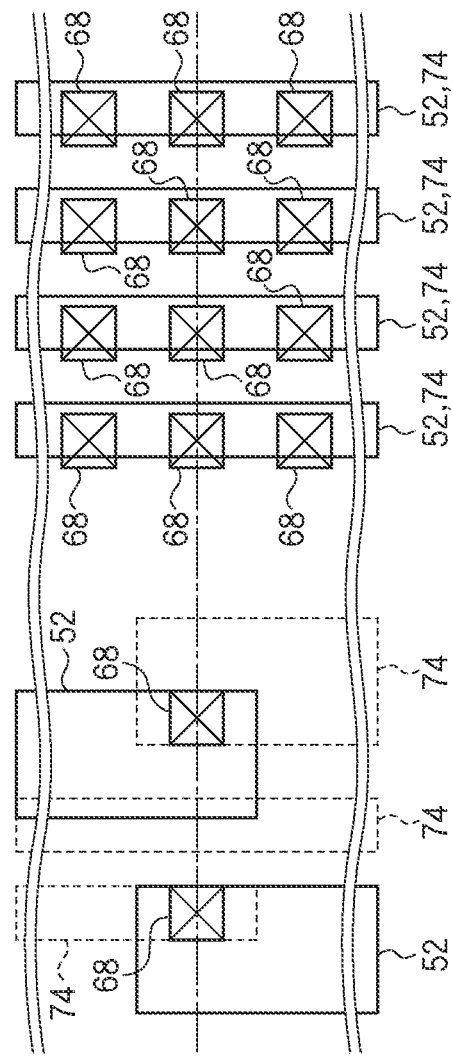
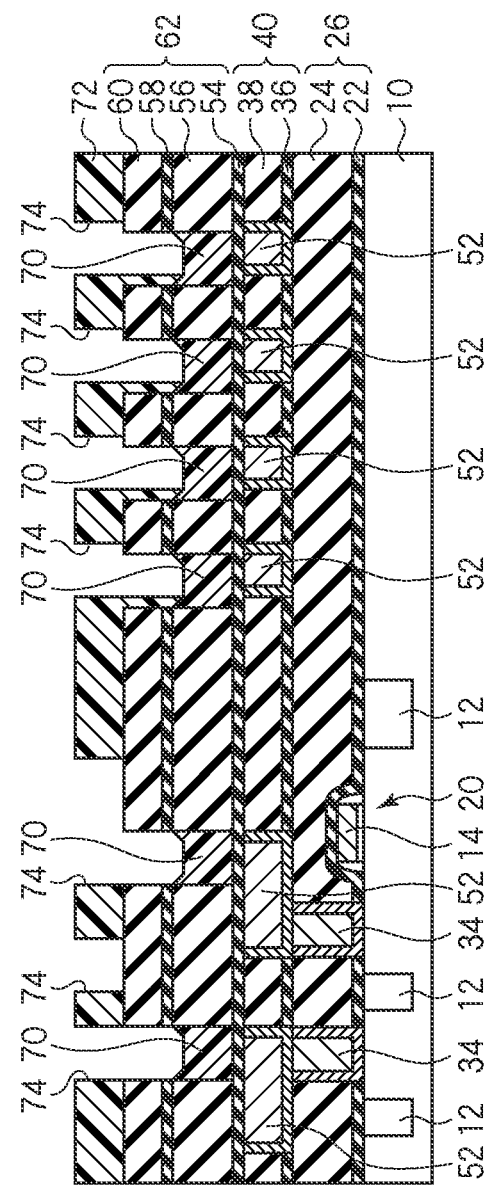
FIG. 12A
FIG. 12B

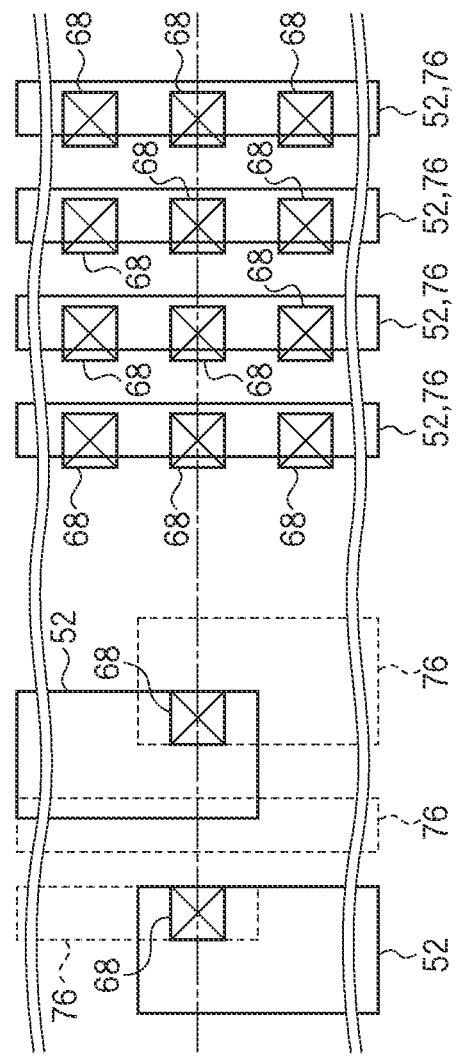
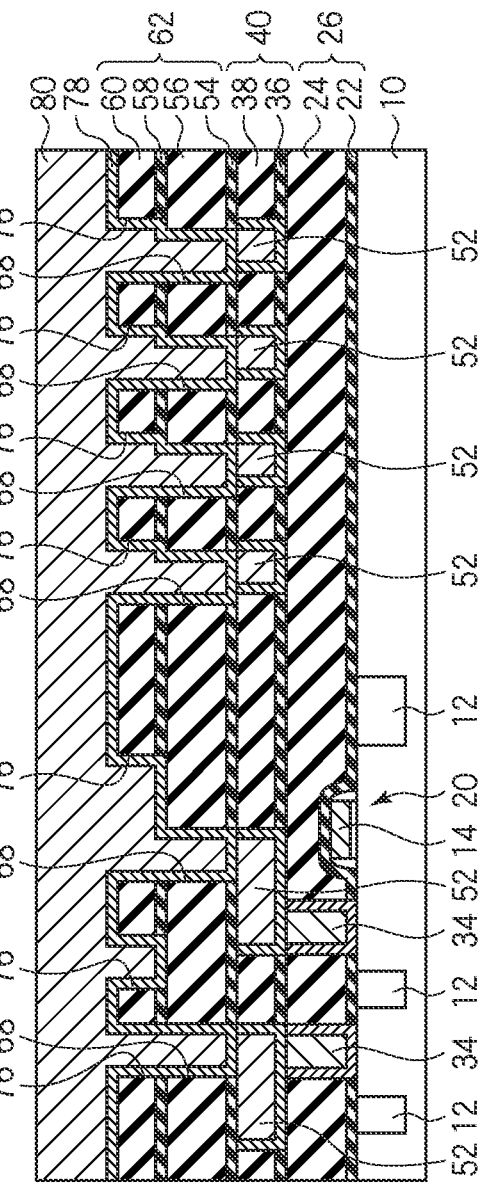
FIG. 16A
FIG. 16B

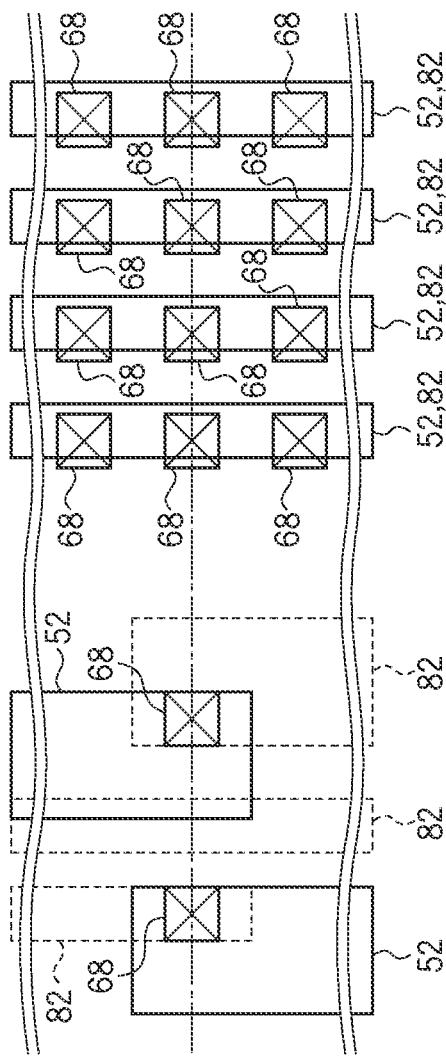
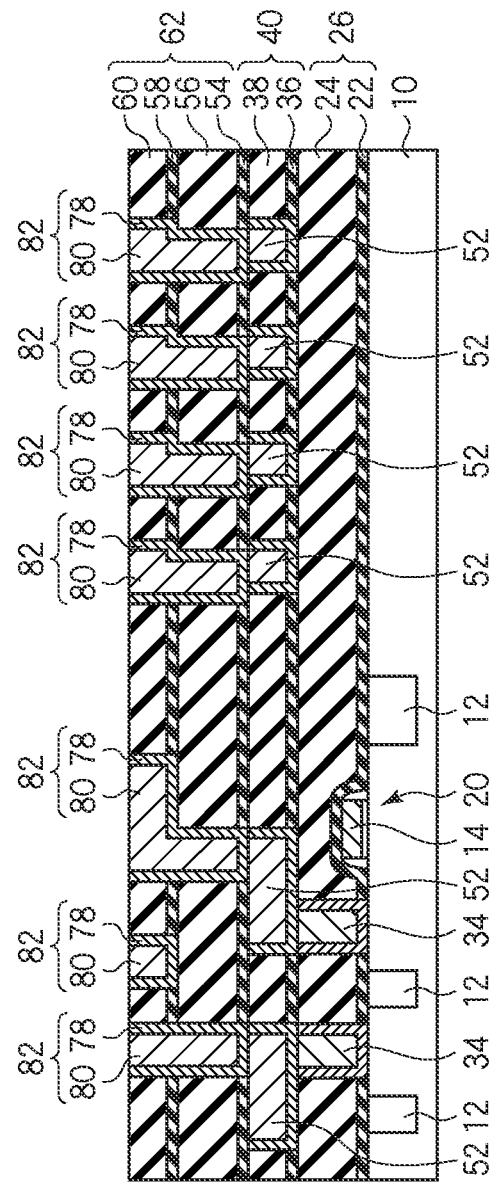
FIG. 17A
FIG. 17B

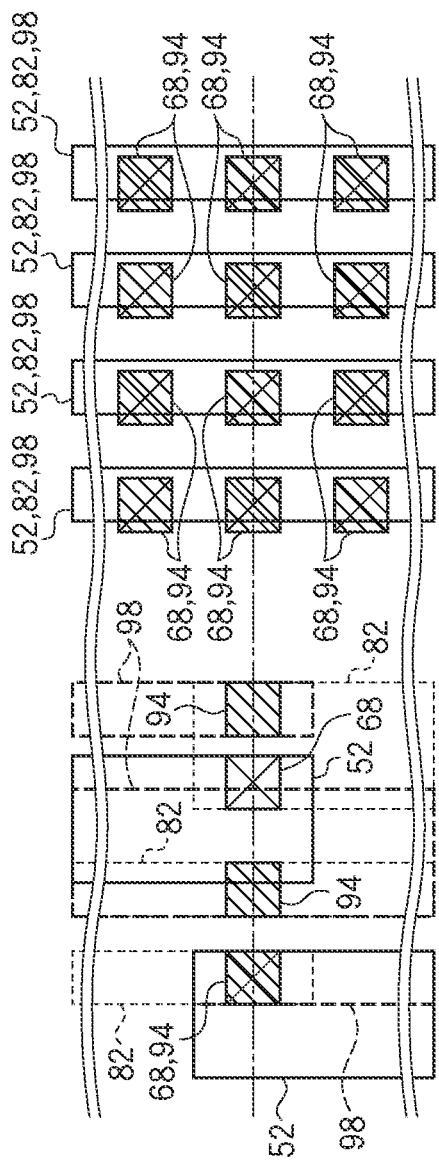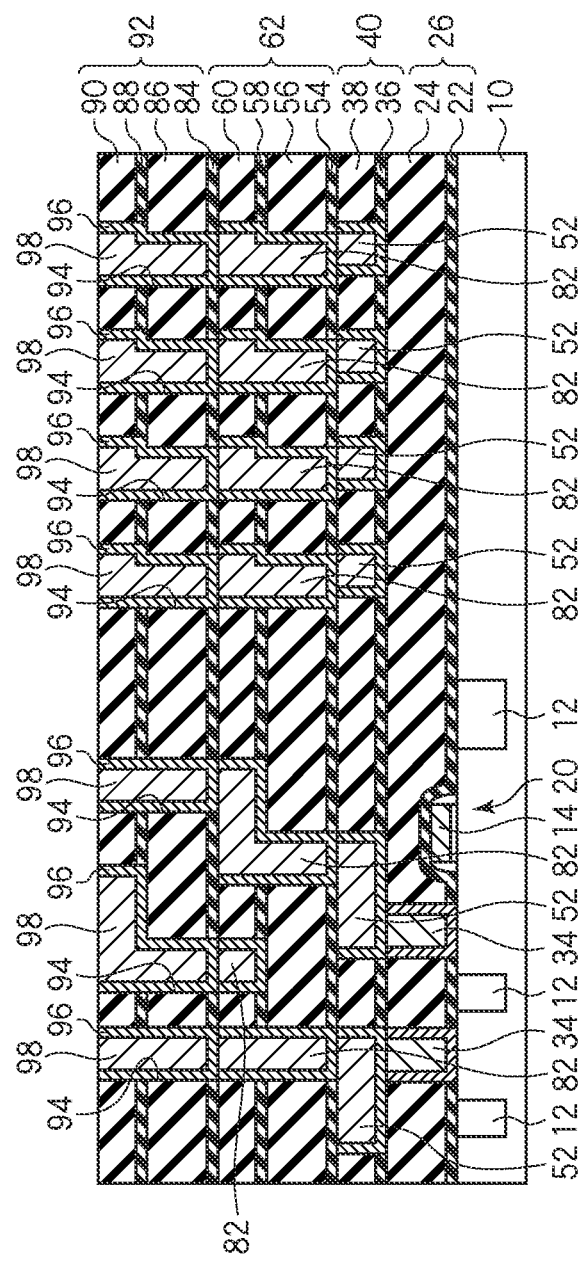
FIG. 18A
FIG. 18B

SEMICONDUCTOR DEVICE INCLUDING CAPACITOR OF INTERCONNECTION

CROSS REFERENCE TO RELATED APPLICATIONS

This application is based upon and claims the benefit of priority of the prior Japanese Patent Application No. 2009-275622, filed on Dec. 3, 2009, the entire contents of which are incorporated herein by reference.

FIELD

The embodiments discussed herein are related to a semiconductor device and a method of manufacturing a semiconductor device, more specifically, a semiconductor device including a capacitor and a method of manufacturing the same.

BACKGROUND

As one of the capacitor used in semiconductor devices is a capacitor using multi-level interconnection structures. In such inter-interconnection capacitor, neighboring interconnection patterns form a pair of electrodes, and the inter-layer insulating film between them forms a capacitor dielectric film.

The following are examples of related: Japanese Laid-open Patent Publication No. 2003-249559, and Japanese Laid-open Patent Publication No. 2004-221498.

Accompanying the downsizing, etc. of the devices, the capacitance per a unit area of the inter-interconnection capacitor is required to be increased. The most effective means for increasing the capacitance of the inter-interconnection capacitor is to decrease the distance between the interconnections.

However, a minimum space between the interconnections is limited by photolithographic technology, and a minimum processing dimension decided by the design rules for a generation of the device is the minimum space between the interconnection patterns. Accordingly, it has been difficult to increase the capacitance of the inter-interconnection capacitor by decreasing the space between the interconnections to a space which exceeds a minimum processing dimension of the photolithography.

SUMMARY

According to one aspect of an embodiment, there is provided a semiconductor device including a capacitor including a plurality of interconnection layers stacked over each other, the plurality of interconnection layers each including a plurality of electrode patterns extended in a first direction, a plurality of via parts provided between the plurality of interconnection layers and electrically interconnecting the plurality of the electrode patterns between the interconnection layers adjacent to each other, and an insulating films formed between the plurality of interconnection layers and the plurality of via parts, wherein each of the plurality of via parts is laid out, offset from a center of the electrode pattern in a second direction intersecting the first direction, and the plurality of electrode patterns has a larger line width at parts where the via parts are connected to, and a distance between the electrode patterns and the adjacent electrode patterns is reduced at the parts.

According to another aspect of an embodiment, there is provided a semiconductor device including a capacitor including a first interconnection layer including a first electrode pattern and a second electrode pattern extended in a first direction, a second interconnection layer including a third electrode pattern formed above the first electrode pattern and extended in the first direction and a fourth electrode pattern formed above the second electrode pattern and extended in the first direction, a first via part formed between the first electrode pattern and the third electrode pattern, and electrically interconnecting the first electrode pattern and the third electrode pattern, a second via part formed between the second electrode pattern and the fourth electrode pattern, and electrically interconnecting the second electrode pattern and the fourth electrode pattern, an insulating film formed between the first interconnection layer, the second interconnection layer, the first via part and the second via part, wherein the first via part is laid out, offset from a center of the first electrode pattern in a second direction intersecting the first direction, and the third electrode pattern has a line width increased at a part where the first via part is connected to, and a distance with respect to the fourth electrode pattern is reduced at the part.

According to further another aspect of an embodiment, there is provided a method of manufacturing a semiconductor device including forming over a semiconductor substrate a first interconnection layer including a first electrode pattern and a second electrode pattern extended in a first direction, forming an insulating film over the semiconductor substrate with the first interconnection layer formed, forming in the insulating film a first via-hole down to the first electrode pattern and a second via-hole down to the second electrode pattern, forming in a surface side of the insulating film a first interconnection trench position above the first electrode pattern, connected to the first via-hole and extended in the first direction, and a second interconnection trench position above the second electrode pattern, connect to the second via-hole and extended in the first direction, and burying in the first via-hole, the second via-hole, the first interconnection trench and the second interconnection trench a conductive film to form a second interconnection layer including a third electrode pattern electrically connected to the first electrode pattern via the first via-hole and a fourth electrode pattern electrically connected to the second electrode pattern via the second via-hole, in forming the first via-hole and the second via-hole, the first via-hole being laid out, offset from a center of the first electrode pattern in a second direction intersecting the first direction, and the second via-hole being laid out, offset from a center of the second electrode pattern in the second direction.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 4A-4C, 5B, 6B, 7B, 8B, 9B, 10B, 11B, 12B, 13B, 14B, 15B, 16B, 17B, 18B and 19-27 are cross-sectional views illustrating a method of manufacturing the semiconductor device according to the first embodiment;

FIGS. 5A, 6A, 7A, 8A, 9A, 10A, 11A, 12A, 13A, 14A, 15A, 16A, 17A and 18A are plan views illustrating the method of manufacturing the semiconductor device according to the first embodiment;

DESCRIPTION OF EMBODIMENTS

A First Embodiment

A semiconductor device and a method of manufacturing the same according to a first embodiment will be described with reference to FIGS. 1 to 28.

Figure 1:
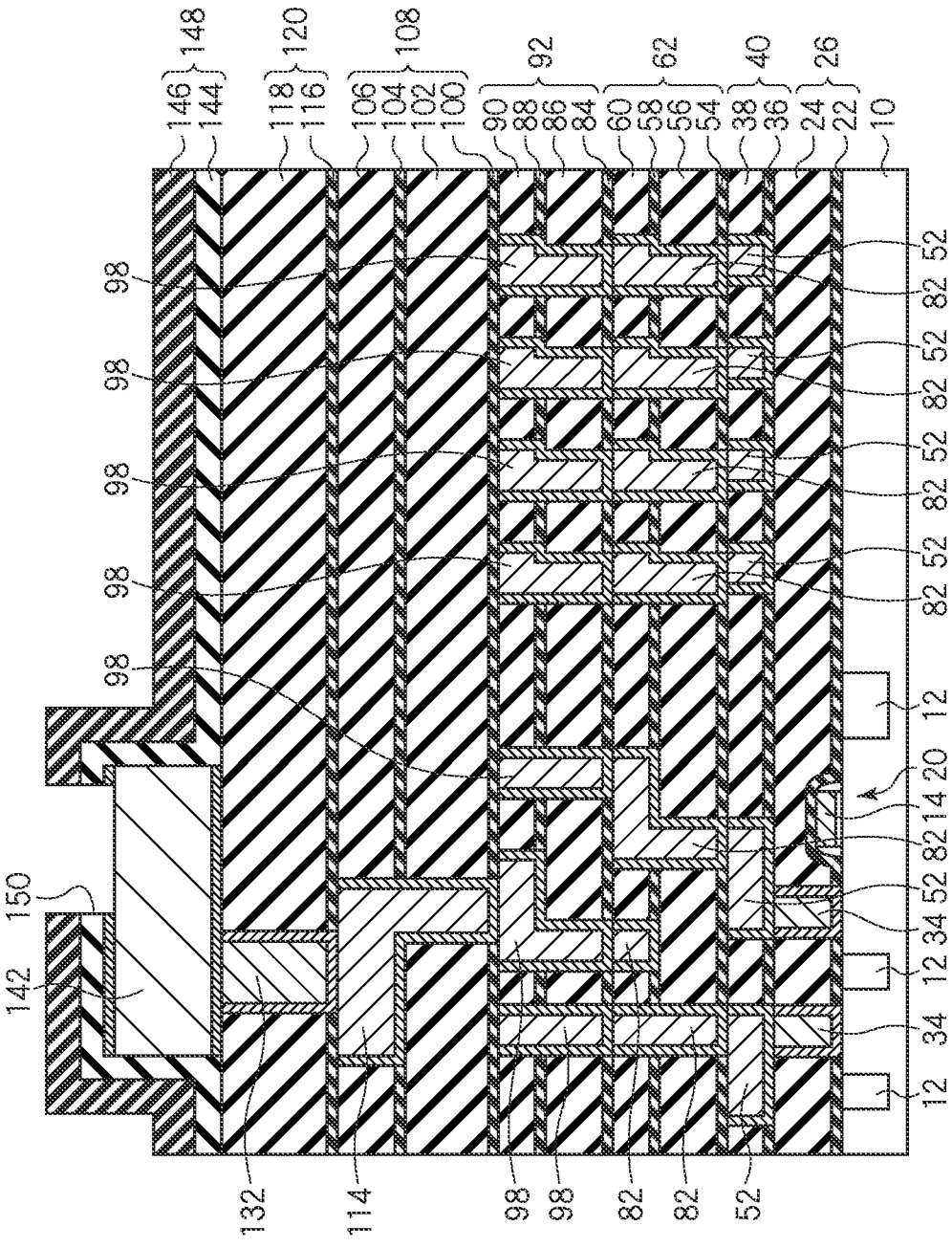
FIG. 1 is a diagrammatic cross-sectional view illustrating a structure of a semiconductor device according to a first embodiment.
Figure 2:
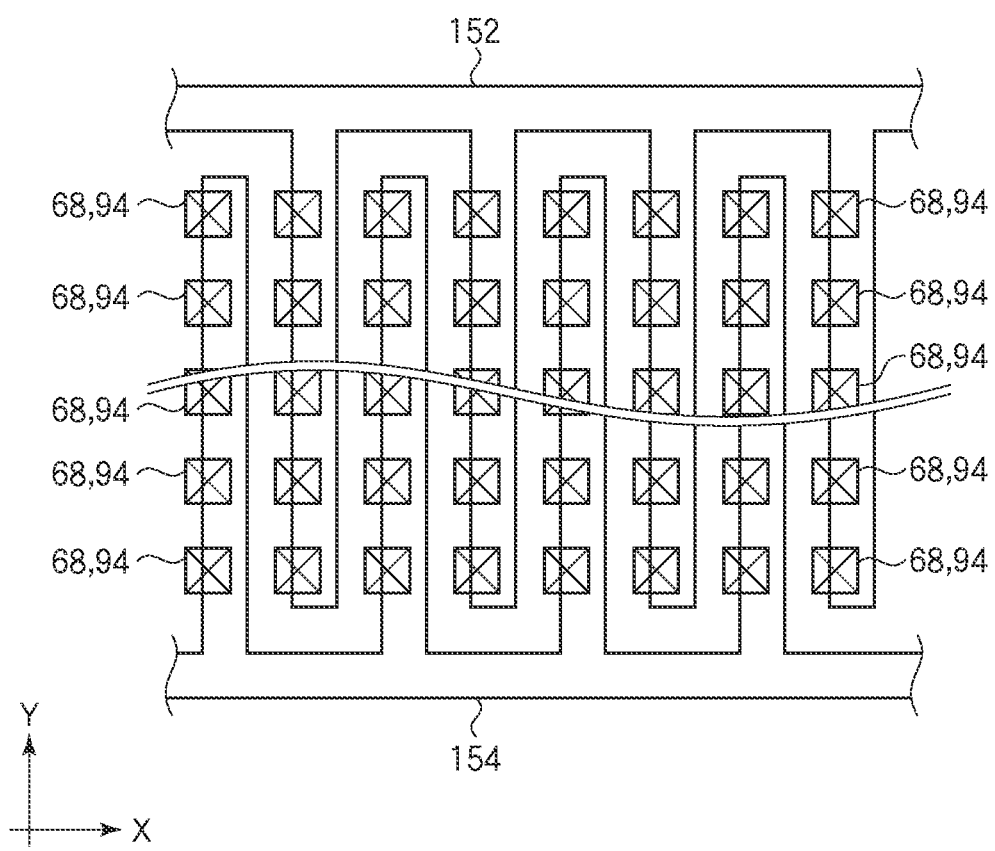
FIG. 2 is a plan view illustrating the structure of the semiconductor device according to the first embodiment.
Figure 3A:
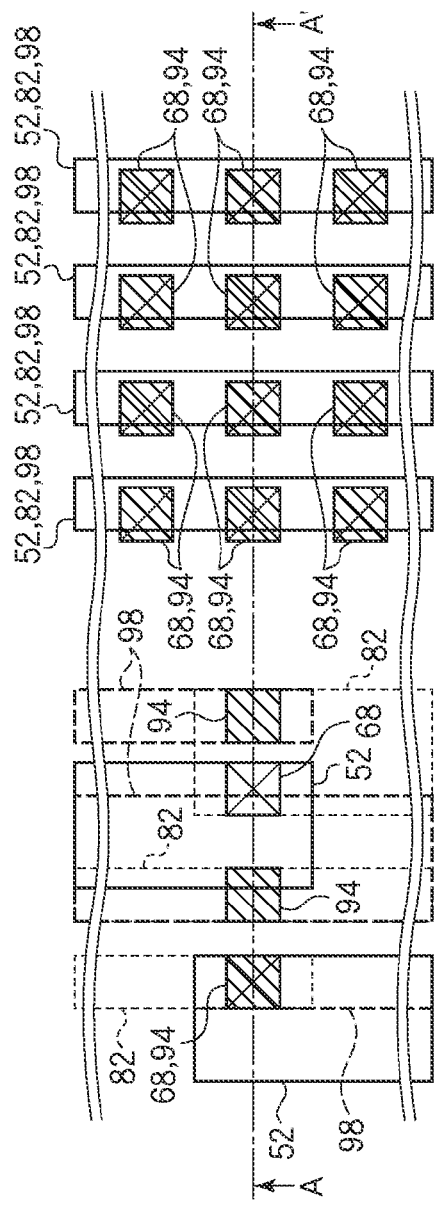
FIG. 3A is a plan view illustrating a relationship between an ordinary circuit part and an interconnection capacitor part of the semiconductor device according to the first embodiment.
Figure 3B:
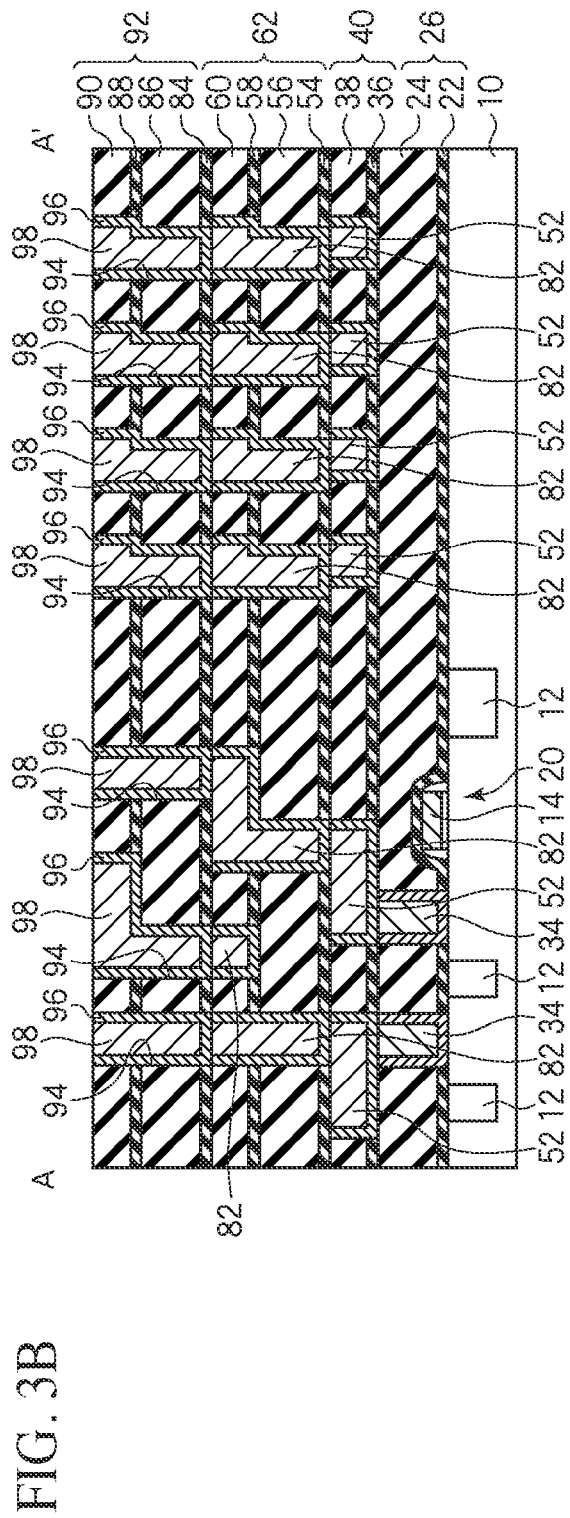
FIG. 3B is a diagrammatic cross-sectional view illustrating the relationship between the ordinary circuit part and the interconnection capacitor part of the semiconductor device according to the first embodiment.

FIG. 1 is a diagrammatic cross-sectional view illustrating a structure of the semiconductor device according to the present embodiment. FIG. 2 is a plan view illustrating the structure of the semiconductor device according to the present embodiment. FIGS. 3A and 3B are a plan view and a cross-sectional view illustrating a relationship between an ordinary circuit part and an interconnection capacitor part of the semiconductor device according to the present embodiment. FIGS. 4A-27 are cross-sectional views illustrating the method of manufacturing the semiconductor device according to the present embodiment. FIG. 28 is a flow chart illustrating a method of designing the semiconductor device according to the present embodiment.

First, the structure of the semiconductor device according to the present embodiment will be described with reference to FIGS. 1 to 3B.

A device isolation film 12 for defining an active region is formed in a silicon substrate 10. In the active region of the silicon substrate 10 defined by the device isolation film 12, a MIS transistor 20 including a gate electrode 14 and source/drain regions 16, 18 is formed. Over the silicon substrate 10 with the MIS transistor 20 formed on, an inter-layer insulating film including a silicon nitride film 22 and a silicon oxide film 24 is formed. In the inter-layer insulating film 26, contact plugs 34 connected to the silicon substrate 10 are buried in.

Over the inter-layer insulating film 26 with the contact plugs 34 buried in, an inter-layer insulating film 40 including a silicon nitride film 36 and a silicon oxide film 38 is formed. In the inter-layer insulating film 40, an interconnection layer 52 is buried.

Over the inter-layer insulating film 40 with the interconnection layer 52 buried in, an inter-layer insulating film 62 including a silicon nitride film 54, a silicon oxide film 56, a silicon nitride film 58 and a silicon oxide film 60 is formed. In the inter-layer insulating film 62, an interconnection layer 82 is buried.

Over the inter-layer insulating film 62 with the interconnection layer 82 buried in, an inter-layer insulating film 92 including a silicon nitride film 84, a silicon oxide film 86, a silicon nitride film 88 and a silicon oxide film 90 is formed. In the inter-layer insulating film 92, an interconnection layer 98 is buried.

Over the inter-layer insulating film 92 with the interconnection layer 98 buried in, an inter-layer insulating film 108 including a silicon nitride film 100, a silicon oxide film 102, a silicon nitride film 104 and a silicon oxide film 106 is formed. In the inter-layer insulating film 108, an interconnection layer 114 is buried in.

Over the inter-layer insulating film 108 with the interconnection layer 114 buried in, an inter-layer insulating film 120 including a silicon nitride film 116 and a silicon oxide film 118 is formed. In the inter-layer insulating film 120, a contact plug 132 connected to the interconnection layer 114 is buried in.

Over the inter-layer insulating film 120 with the contact plug 132 buried in, an interconnection layer 142 is formed. Over the interconnection layer 142, a cover film 148 including a silicon oxide film 144 and a silicon nitride film 146 is formed. In the cover film 148, a pad opening 150 is formed down to the interconnection layer 142.

In the semiconductor device illustrated in FIG. 1, the right side of the drawing illustrates the interconnection capacitor part, and the left side of the drawing illustrates one example of the ordinary circuit part.

In the interconnection capacitor part, an interconnection capacitor is formed by the interconnection layers 52, 82, 98. As exemplified in FIG. 2, the respective interconnection layers 52, 82, 98 forming the interconnection capacitor have two comb-shaped electrode patterns 152, 154, and the electrode patterns 152, 154 are laid out with the comb teeth alternately inserted in each other. Thus, between the two electrode patterns 152, 154, the capacitor having, as the capacitor dielectric film, the inter-layer insulating films with the electrode patters buried in are formed.

As exemplified in FIG. 3A, the electrode patterns of the respective interconnection layers 62, 82, 98 are laid out, overlaid over each other as viewed in plane (see FIG. 3A). As exemplified in FIG. 3B, the interconnection layer 52 and the interconnection layer 82 are electrically connected to each other via via-holes 68, and the interconnection layer 82 and the interconnection layer 98 are electrically connected to each other via via-holes 94.

In the semiconductor device according to the present embodiment, the via holes 68 interconnecting the interconnection layer 52 and the interconnection layer 82, and the via holes 94 interconnecting the interconnection layer 82 and the interconnection layer 98 are laid out, offset from the centers of the comb-shaped electrode patterns 152, 154. The direction in which the via-holes 68, 94 are offset intersects the extending direction of the electrode patterns 152, 154. With the comb teeth of the electrode patterns 152, 154 formed extended in the Y direction as exemplified in FIG. 2, the centers of the via-holes 68, 94 are laid out, offset from the centers of the electrode patterns 152, 154 in the direction along the X direction (-X direction here).

On the other hand, in the ordinary circuit part, as exemplified in FIG. 3A, as in the general layout of the interconnection patterns, the via-holes 68, 94 are laid out, positioned in the centers of the interconnection patterns of the interconnection layers 52, 82, 98.

In other words, the offset amount of the via-holes 68, 94 from the centers of the electrode patterns 152, 154 formed in the interconnection capacitor part is larger than the offset of the via-holes 68, 94 from the centers of the interconnection patterns formed in the ordinary circuit part.

In the semiconductor device according to the present embodiment, the via-holes 68, 84 are laid out, offset from the centers of the electrode patterns 152, 154 so as to increase the capacitance per a unit area of the interconnection capacitor.

To increase the capacitance per a unit area of the interconnection capacitor, it is effective to decrease the distance between the electrode patterns 152, 154. However, the electrode patterns 152, 154 are formed in the same processing, and the distance between the electrode patterns 152, 154 cannot be set at a value smaller than a minimum processing dimension of the lithography.

On the other hand, the via-holes 68, 94 are formed by a photolithography process which differs from a photolithography process for forming the interconnection trenches for the electrode patterns 152, 154 to be buried in, and can be laid out irrespective of the layout of the electrode patterns 152, 154 as long as a required interconnection relationship can be retained. That is, the via-holes 68, 94 can be laid out, offset from the centers of the electrode patterns 152, 154.

Even with the via-holes 68, 94 laid out, offset from the centers of the electrode patterns 152, 154 of the interconnection layers 52, 82, 98, the substantial distance between the electrode patterns 152, 154 is not changed. However, in the parts where the via-holes 68, 94 and the electrodes patterns 152, 154 are opposed to each other, the space between them is smaller than the distance between the electrode patterns 152, 154 (see FIG. 2).

When the via-holes 68, 94 and the electrode patterns 152, 154 are formed by dual damascene process as described later, the outer edges of the electrode patterns 152, 154 are also defined by a configuration of the via-holes 68, 94. With reference to the example of FIG. 2, the electrode patterns 152, 154 are formed also all over the regions where the via-hoes 68, 94 are formed. That is, the line width of the electrode patterns 152, 154 of the interconnections 82, 98 is larger than that in the parts where the via-holes 68, 94 are formed, and the distance between the adjacent electrode patterns 154, 152 is smaller. The increase of the line width of the electrode patterns 152, 154 of the interconnection layers 82, 98 corresponds to the offset amount of the via-holes 68, 94 from the electrode patterns 152, 154.

Thus, the capacitance per a unit area as a whole can be increased in comparison with the capacitance given by arranging the via-holes 68, 94 without being offset from the electrode patterns 152, 154.

Next, the method of manufacturing the semiconductor device according to the present embodiment will be described with reference to FIGS. 4A to 27.

First, in the surface of the silicon substrate 10, the device isolation film 12 for defining the active region is formed by, e.g., STI (Shallow Trench Isolation) method.

Figure 4A:
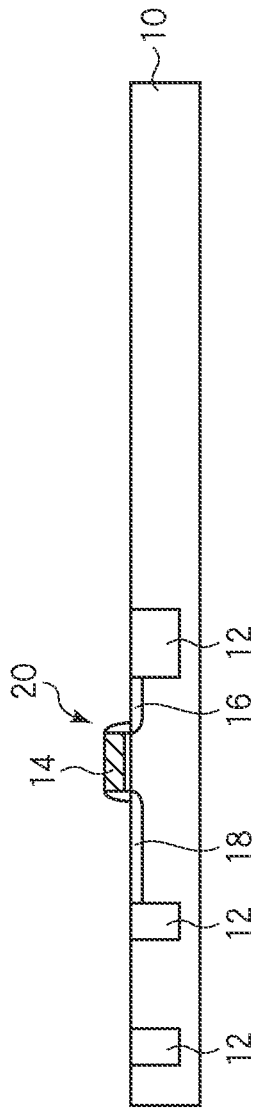

Then, in the active region of the silicon substrate 10 defined by the device isolation film 12, the MIS transistor 20 including the gate electrode 14, and the source/drain regions 16, 18 formed in the silicon substrate 10 on both sides of the gate electrode 14 are formed (FIG. 4A).

Then, over the silicon substrate 10 with the MIS transistor 20 formed on, the silicon nitride (SiN) film 22 and the silicon oxide ($SiO_2$) film 24 are formed by, e.g., CVD (Chemical Vapor Deposition) method. Thus, the inter-layer insulating film 26 of the $SiO_2$/SiN structure is formed.

Figure 4B:
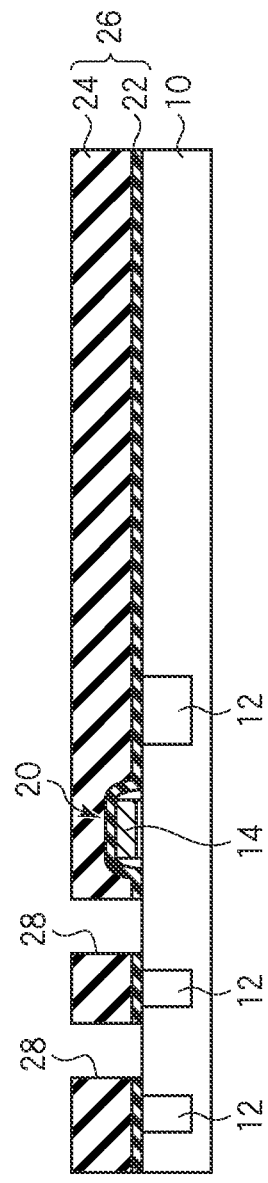

Next, by photolithography and dry etching, the contact holes 28 reaching down to the silicon substrate 10 are formed in the inter-layer insulating film 26 (FIG. 4B).

Next, the barrier metal 30 of, e.g., titanium nitride (TiN) and the tungsten (W) film 32 are deposited over the entire surface by, e.g., sputtering method.

Figure 4C:
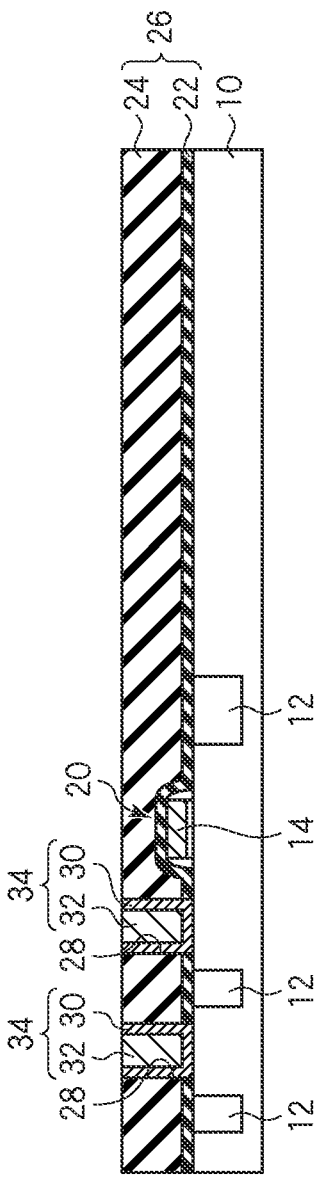

Next, the tungsten film 32 and the barrier metal 30 above the silicon oxide film 24 are removed by, e.g., CMP (Chemical Mechanical Polishing) method to form the contact plugs 34 of the W/TiN structure buried in the contact holes 28 (FIG. 4C).

Next, over the inter-layer insulating film 26 with the contact plugs 34 buried in, the silicon nitride film 36 of, e.g., a 70 nm-thickness, and the silicon oxide film 38 of, e.g., a 300 nm-thickness are formed by, e.g., CVD method. Thus, the inter-layer insulating film 40 of the $SiO_2$/SiN structure is formed.

Then, over the inter-layer insulating film 40, a photoresist film 42 having openings 44 for exposing regions for the interconnection layer to be buried in the inter-layer insulating film 40 is formed by photolithography (FIGS. 5A and 5B).

Then, the inter-layer insulating film 40 is dry etched with the photoresist film 42 as the mask to form, in the inter-layer insulating film 40 in the openings 44, the interconnection trenches 46 down to the contact plugs 34 and the inter-layer insulating film 26.

Next, the photoresist film 42 is removed by, e.g., asking (FIGS. 6A and 6B). The photoresist film 42 may be removed after the silicon oxide film 38 has been etched and before the silicon nitride film 36 is removed.

Then, a film which functions as the diffusion preventing film for the Cu interconnections, e.g., the barrier metal 48 of, e.g., a 30 nm-thickness tantalum (Ta) film, a film which is to be the seed for forming copper film by electroplating, e.g., a seed film of, e.g., a 80 nm-thickness copper film (not illustrated) are formed over the entire surface by, e.g., sputtering method.

Figure 7A:
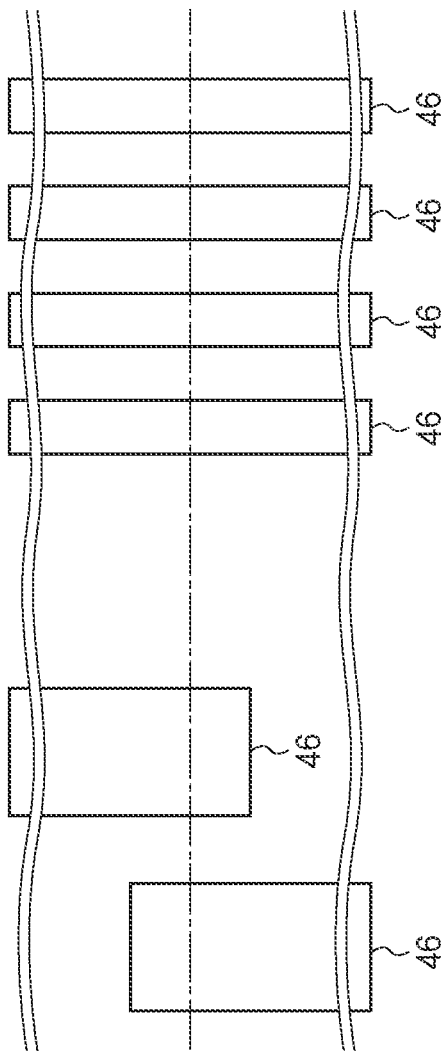
Figure 7B:
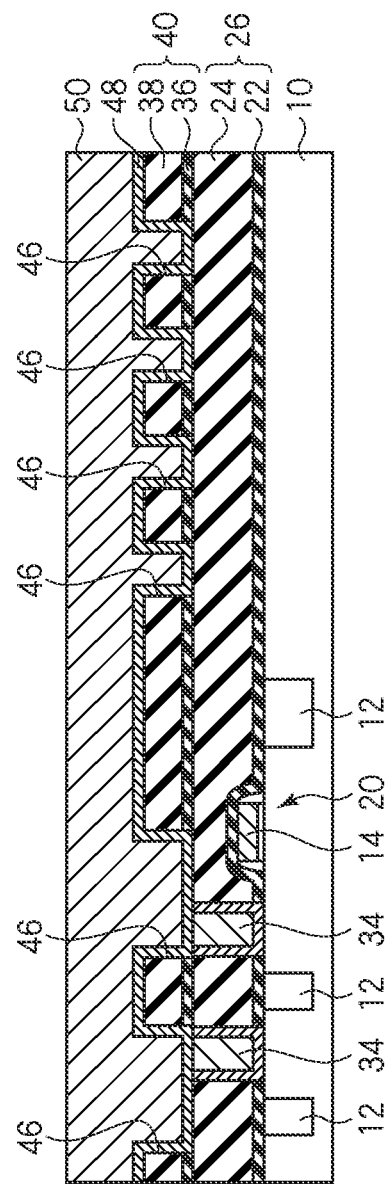

Next, the copper (Cu) film of, e.g., a 1.2 μm-thickness copper (Cu) film is formed on the barrier metal 48 by electroplating method (FIGS. 7A and 7B).

Then, the copper film 50 and the barrier metal 48 above the inter-layer insulating film 40 are removed by, e.g., CMP method to form the interconnection layer 52 of the Cu/Ta structure buried in the interconnection trenches 46 (FIGS. 8A and 8B).

Next, over the inter-layer insulating film 40 with the interconnection layer 52 buried in, the silicon nitride film 54 of, e.g., a 70 nm-thickness is formed by, e.g., CVD method. The silicon nitride film 54 functions as the diffusion preventing film for the interconnection material of the interconnection layer 52 and as the etching stopper film in forming the openings in the next inter-layer insulating film.

Then, the silicon oxide film 56 of, e.g., a 350 nm-thickness, the silicon nitride film 58 of, e.g., a 70 nm-thickness, and the silicon oxide film 60 of, e.g., a 300 nm-thickness are formed on the silicon nitride film by, e.g., CVD method. Thus, over the inter-layer insulating film 40, the inter-layer insulating film 62 of the SiO$_2$/SiN/SiO$_2$/SiN structure is formed.

Figure 10A:
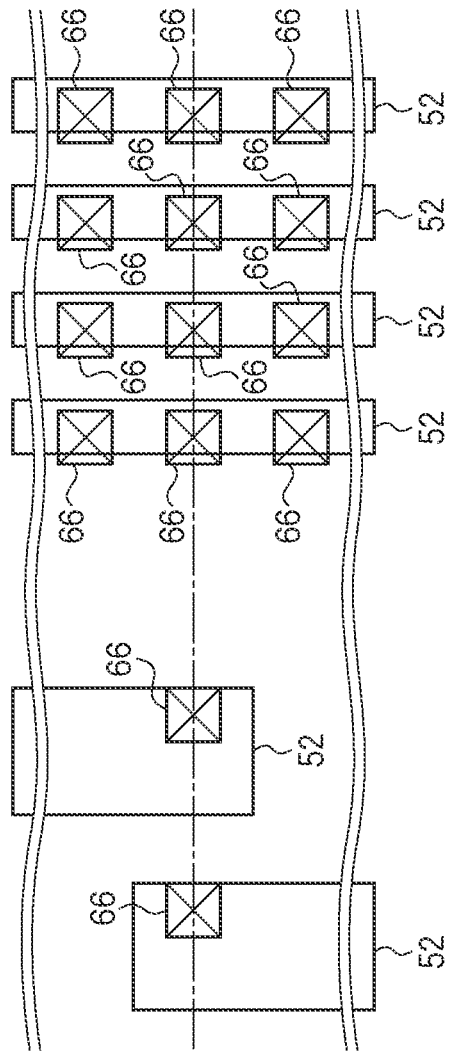
Figure 10B:
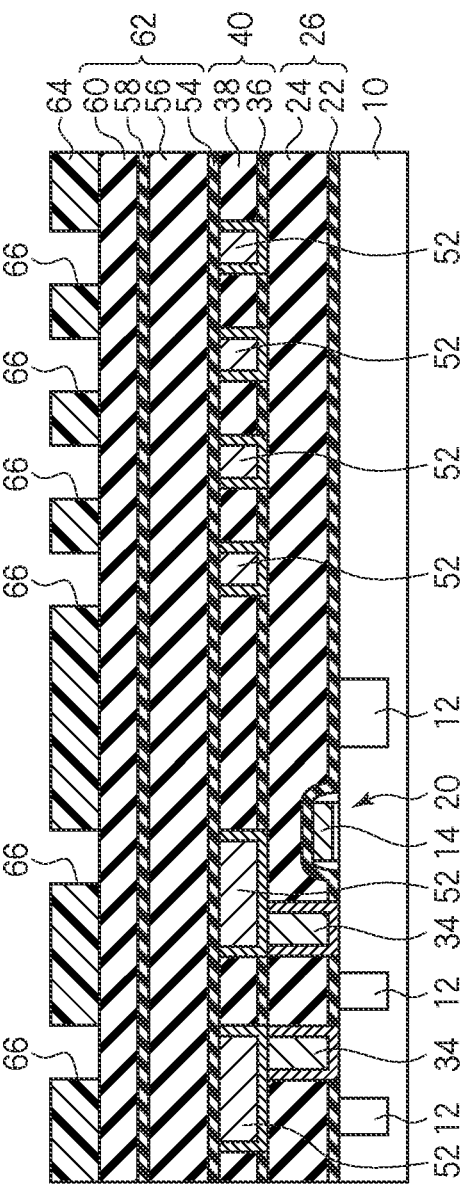

Next, a photoresist film 64 having openings 66 in regions where the via-holes to be connected to the interconnection layer 52 are to be formed is formed on the inter-layer insulating film 62 by photolithography (FIGS. 10A and 10B).

At this time, the openings 66 in the interconnection capacitor part are formed, offset from the centers of the electrode patterns of the interconnection layer 52 in the direction intersecting the extending direction of the electrode patterns (see FIG. 10A). The openings 66 only in the interconnection capacitor part are laid out, offset, and the openings 66 in the ordinary circuit part are laid out, not offset.

Next, with the photoresist film 64 as the mask, the silicon oxide film 60, the silicon nitride film 58 and the silicon oxide film 56 in the openings 66 are sequentially anisotropically etched to open the via-holes 68 up to the top of the silicon nitride film 54.

Figure 11A:
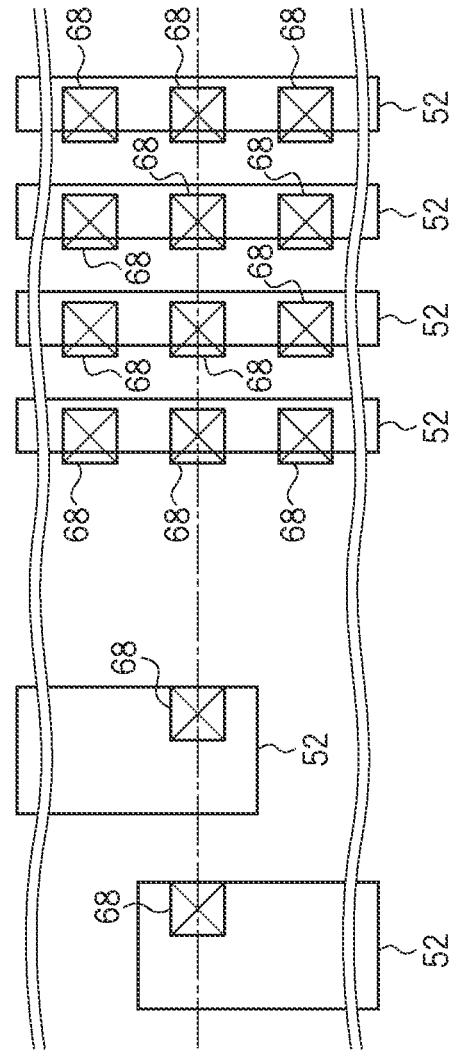
Figure 11B:
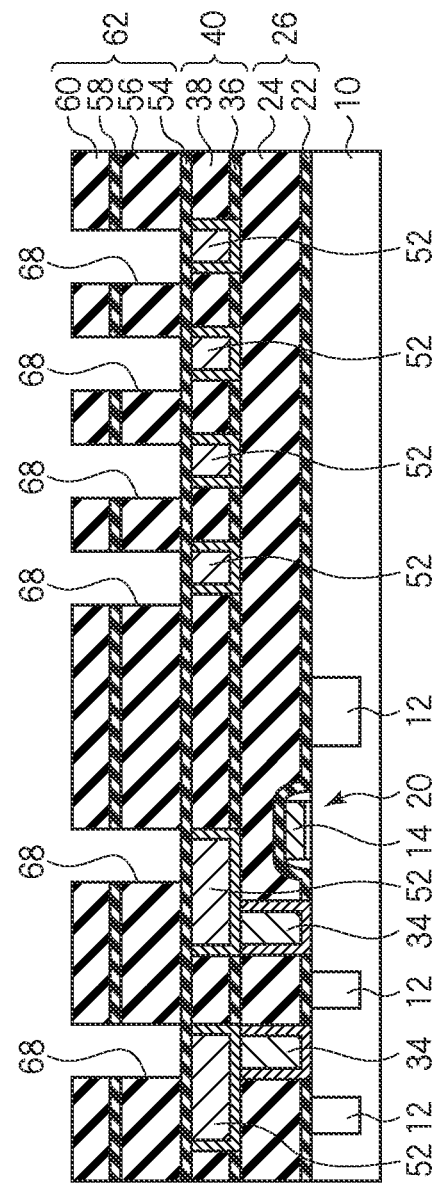

Then, the photoresist film 64 is removed by, e.g., asking (FIGS. 11A and 11B).

Next, a non-photosensitive resin 70 is coated over the entire surface by, e.g., spin coating method.

Then, the upper part of the coated non-photosensitive resin 70 is solved from the surface side or by the total surface etch-back using O$_2$ or others to be removed, and the non-photosensitive resin 70 is left selectively at the bottoms of the via-holes 68. The non-photosensitive resin 70 is for protecting the bottoms of the via-holes 68 when the interconnection trenches are formed in the inter-layer insulating film 62.

Next, a photoresist 72 having openings 74 for exposing regions where the interconnection layer to be buried in the inter-layer insulating film 62 is to be formed is formed on the inter-layer insulating film 62 by photolithography (FIGS. 12A and 12B).

Figure 13A:
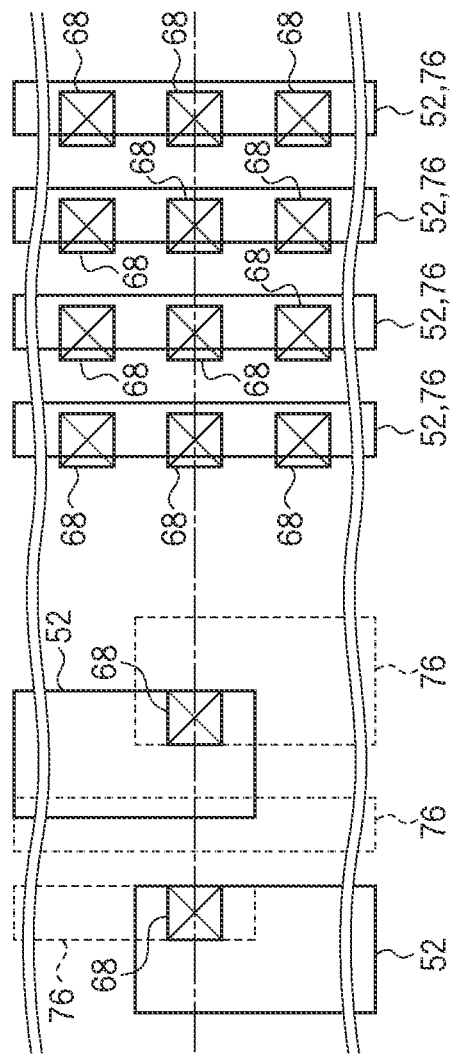
Figure 13B:
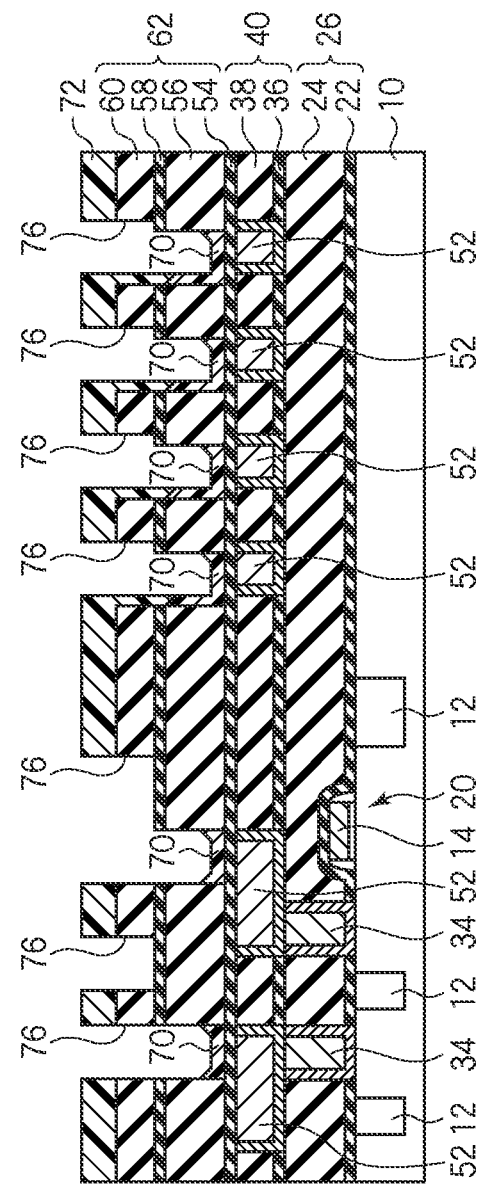

Next, with the photoresist film 72 as the mask and with the silicon nitride film 58 as the stopper, the silicon oxide film 60 in the openings 74 is anisotropically etched to open the interconnection trenches 76 up to the top of the silicon nitride film 58 (FIGS. 13A and 13B).

Figure 14A:
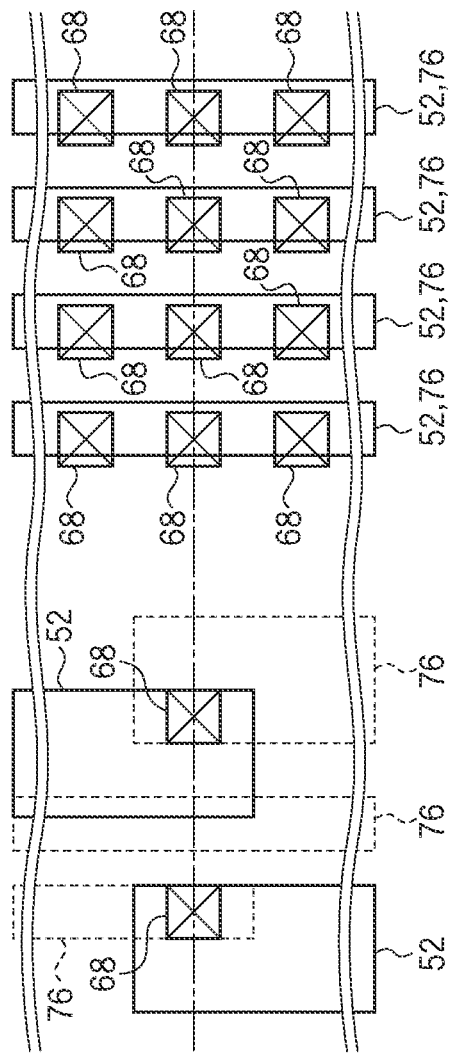
Figure 14B:
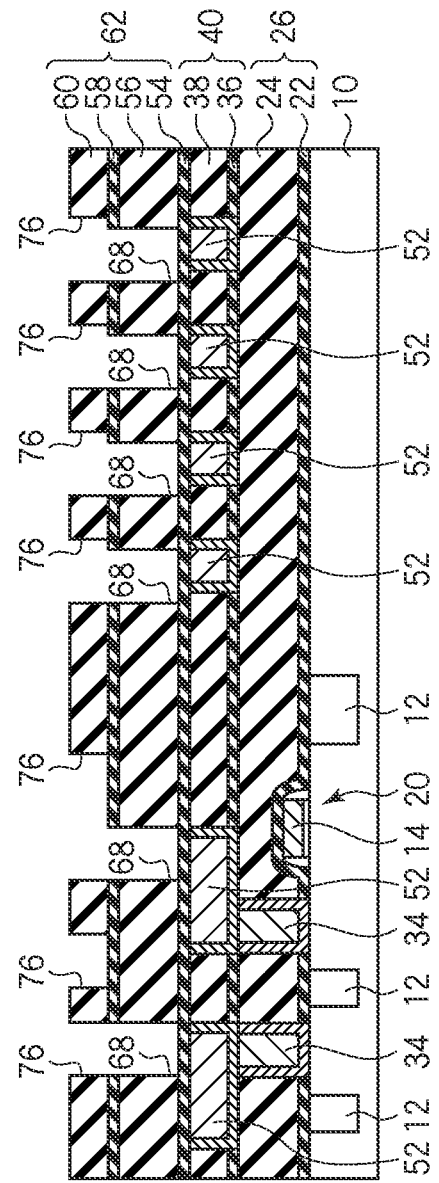

Then, the photoresist film 72 and the non-photosensitive resin 70 are removed by, e.g., asking (FIGS. 14A and 14B).

Figure 15A:
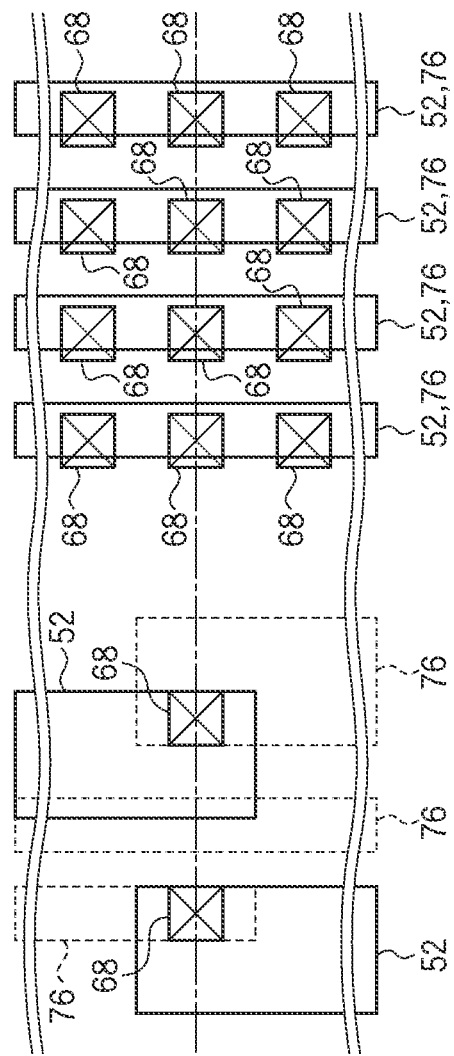
Figure 15B:
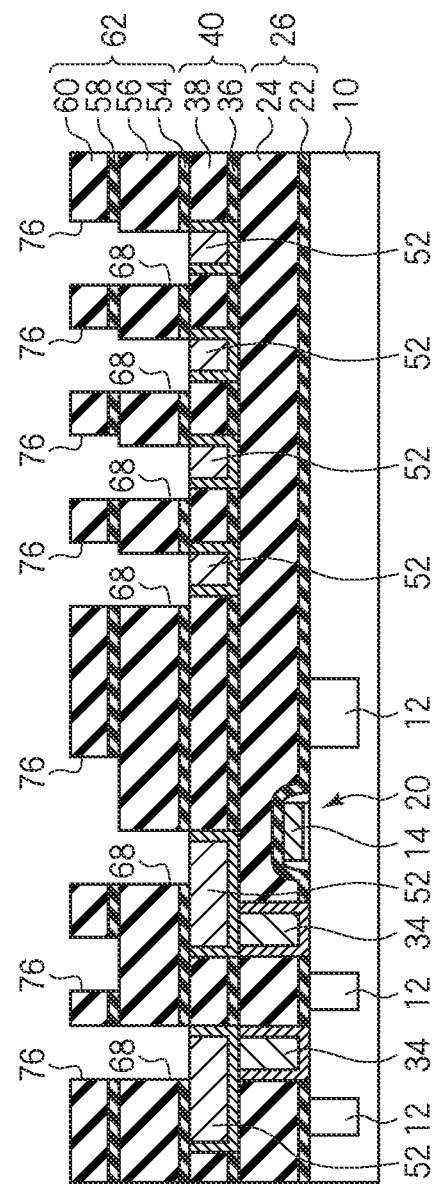

Next, the silicon nitride films 58, 54 are anisotropically etched with the silicon oxide films 60, 56 as the mask to open the interconnection trenches 76 up to the top of the silicon oxide film 56 and the via-holes 68 up to the top of the interconnection layer 52 (FIGS. 15A and 15B).

Then, a film which functions as the diffusion preventing film of the Cu interconnections, e.g., the barrier metal 78 of tantalum (Ta) film of, e.g., a 30 nm-thickness, and a film which is to be the seed for forming the copper film by electroplating, e.g., a seed film (not illustrated) of a copper of, e.g., a 80 nm-thickness are formed over the entire surface by, e.g., sputtering method.

Next, the copper (Cu) film 80 of, e.g. a 1.2 μm-thickness is formed on the barrier metal 78 by electroplating method (FIGS. 16A and 16B).

Then, the copper film 80 and the barrier metal 78 above the inter-layer insulating film 62 are removed by, e.g., CMP method. Thus, the interconnection layer 82 including the via parts buried in the via-holes 68 and the interconnection parts buried in the interconnection trenches 76 and having the Cu/Ta structure connected to the interconnection layer 52 via the via-holes 68 is formed by the dual damascene process of forming the interconnection trenches after forming the via-holes (FIGS. 17A and 17B).

Then, over the inter-layer insulating film 62 with the interconnection layer 82 buried in, in the same way as in the steps of FIGS. 9A, 9B to 10A, 10B, the silicon nitride film 84, the silicon oxide film 86, the silicon nitride film 88 and the silicon oxide film 90 are sequentially formed. Thus, over the inter-layer insulating film 62, the inter-layer insulating film 92 of the SiO$_2$/SiN/SiO$_2$/SiN structure is formed.

Next, in the same way as in the steps of FIGS. 10A, 10B to 17A, 17B, the interconnection layer 98 buried in the via-holes 84 and the interconnection trenches 96 formed in the inter-layer insulating film 92, connected to the interconnection layer 82 via the via-holes 84, and having the Cu/Ta structure is formed (FIGS. 18A and 18B).

Then, over the inter-layer insulating film 92 with the interconnection layer 98 buried in, the silicon nitride film 100 of, e.g., a 70 nm-thickness is formed by, e.g., CVD method. The silicon nitride film 100 functions as the diffusion preventing film for the interconnection material of the interconnection layer 98 and as the etching stopper film in forming the openings in the next inter-layer insulating film.

Then, the silicon oxide film 102 of, e.g., a 900 nm-thickness, the silicon nitride film 104 of, e.g., a 70 nm-thickness and the silicon oxide film 106 of, e.g., a 600 nm-thickness are deposited over the silicon nitride film 100 by, e.g., CVD method. Thus, over the inter-layer insulating film 92, the inter-layer insulating film 108 of the SiO$_2$/SiN/SiO$_2$/SiN structure is formed.

Figure 19:
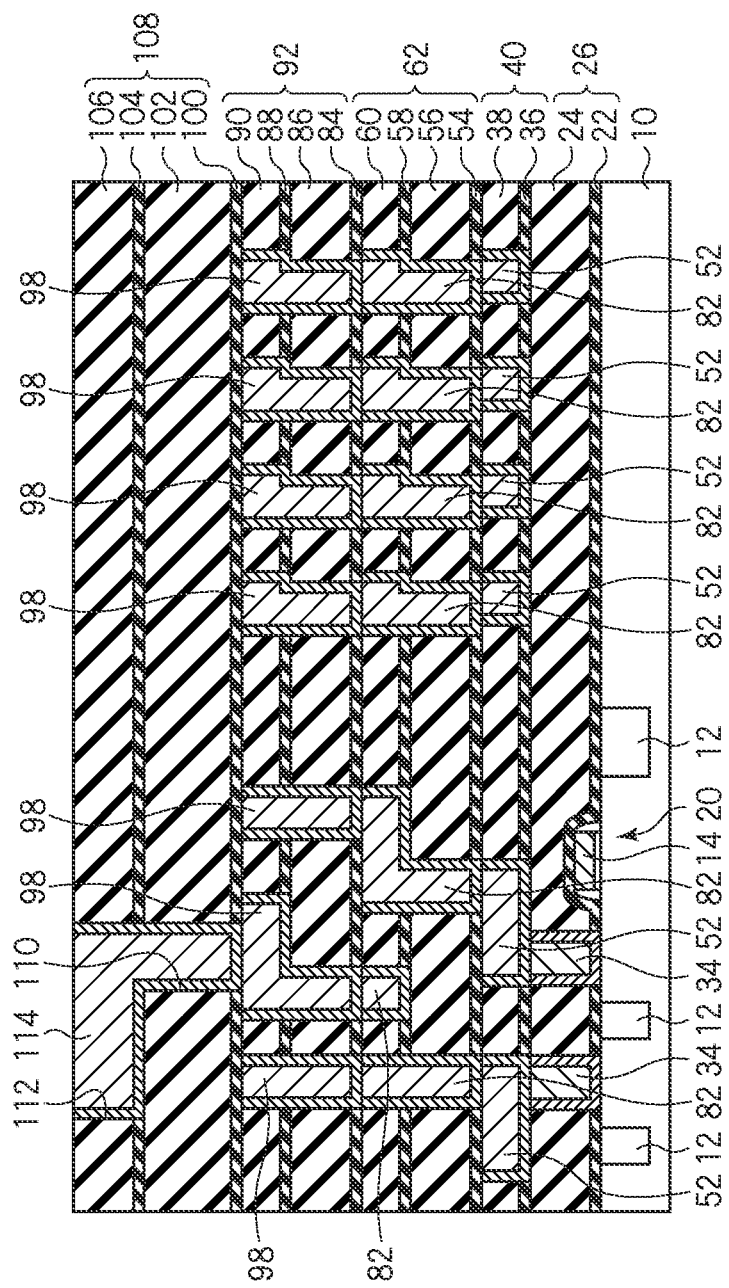

Then, in the same way as in the steps of FIGS. 10A, 10B to 17A, 17B, the interconnection layer 114 buried in the via-holes 110 and the interconnection trenches 112 formed in the inter-layer insulating film 108, connected to the interconnection layer 98 via the via-holes 110, and having the Cu/Ta structure is formed (FIG. 19).

Next, the silicon nitride film 116 of, e.g., a 100 nm-thickness and the silicon oxide film 118 of, e.g., a 900 nm-film thickness are deposited by, e.g., CVD method over the inter-layer insulating film 108 with the interconnection layer 114 buried in. Thus, on the inter-layer insulating film 108, the inter-layer insulating film 120 of the SiO$_2$/SiN structure is formed.

Figure 20:
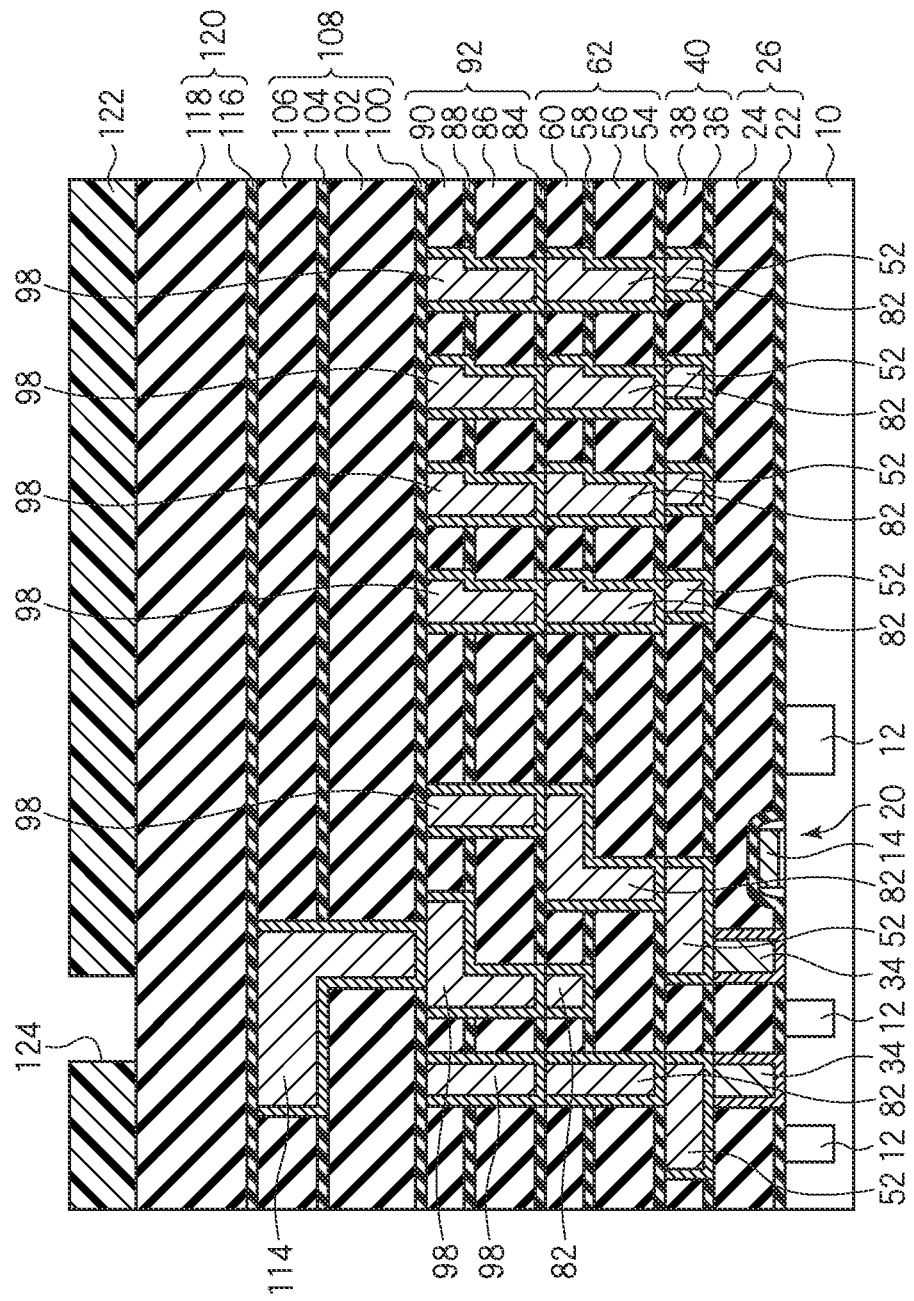

Then, a photoresist film 122 having openings 124 in regions where the via-holes down to the interconnection layer 114 are to be formed is formed on the inter-layer insulating film 120 by photolithography (FIG. 20).

Next, the silicon oxide film 118 in the openings 124 is anisotropically etched with the photoresist film 122 as the mask to open the via-holes 126 up to the top of the silicon nitride film 116.

Next, the photoresist film 122 is removed by, e.g., asking.

Figure 21:
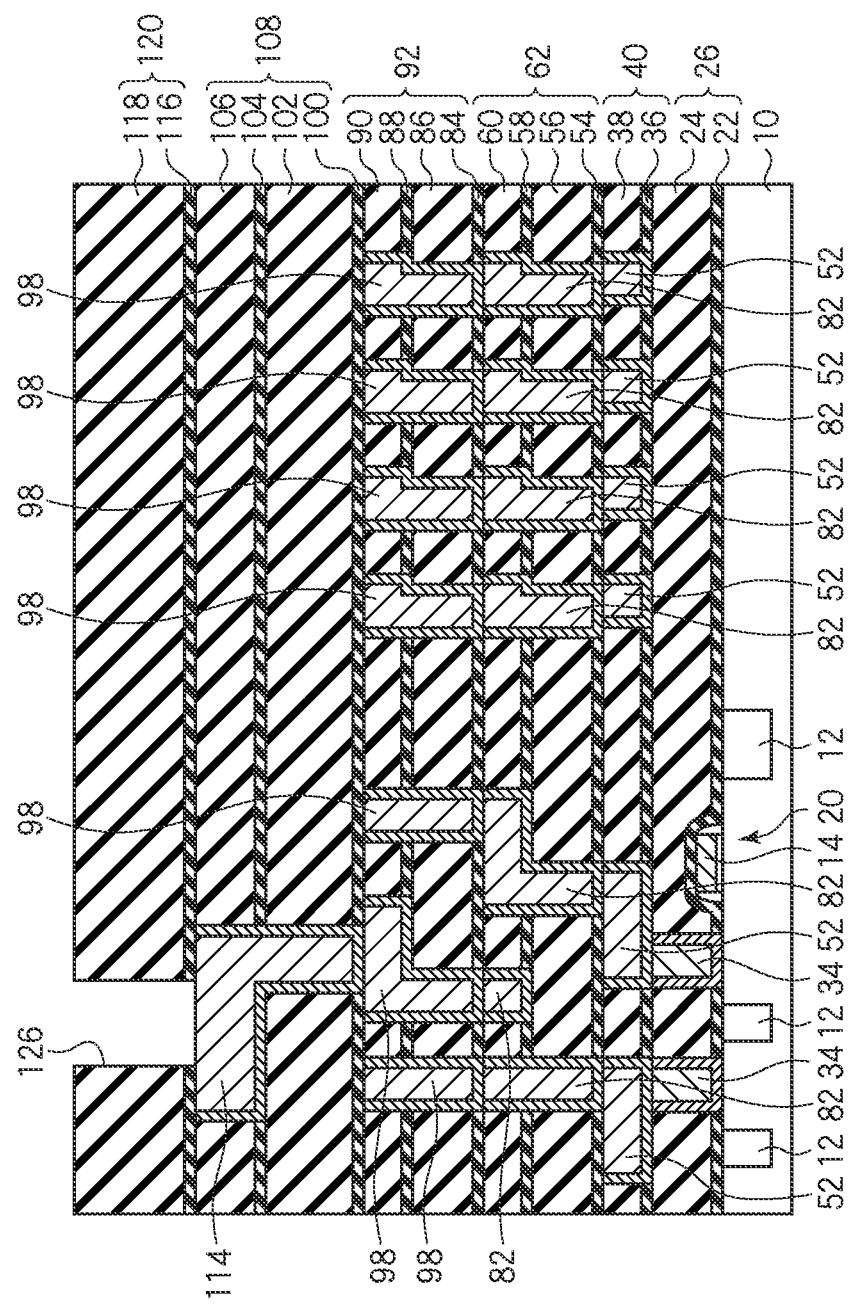

Then, the silicon nitride film 116 is anisotropically etched with the silicon oxide film 118 as the mask to form in the inter-layer insulating film 120 the via-hole 126 down to the interconnection layer 114 (FIG. 21).

Figure 22:
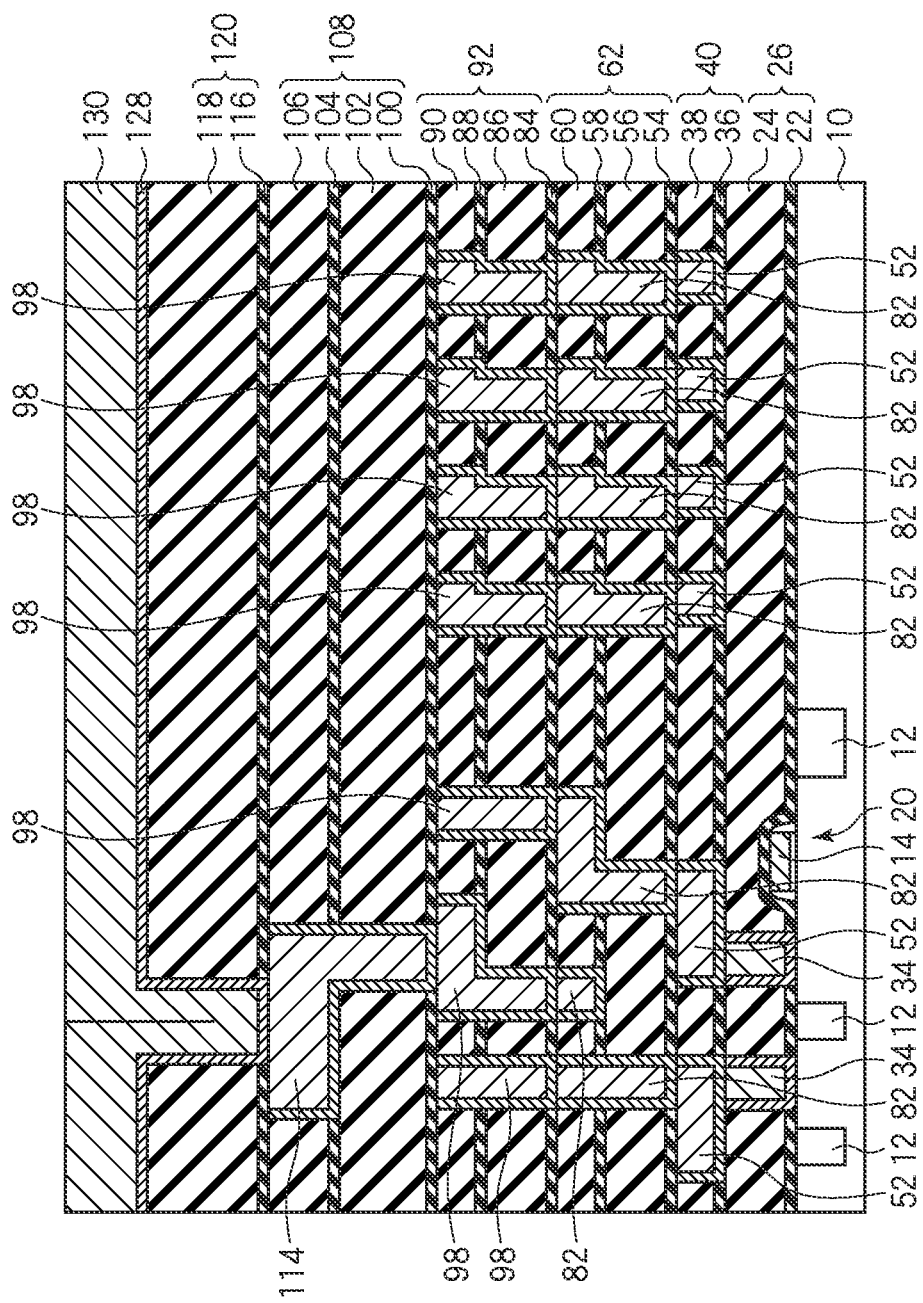

Then, over the entire surface, the barrier metal 128 of, e.g., a 150 nm-thickness titanium nitride is deposited by, e.g., sputtering method, and the tungsten film 130 is deposited by, e.g., CVD method (FIG. 22).

Figure 23:
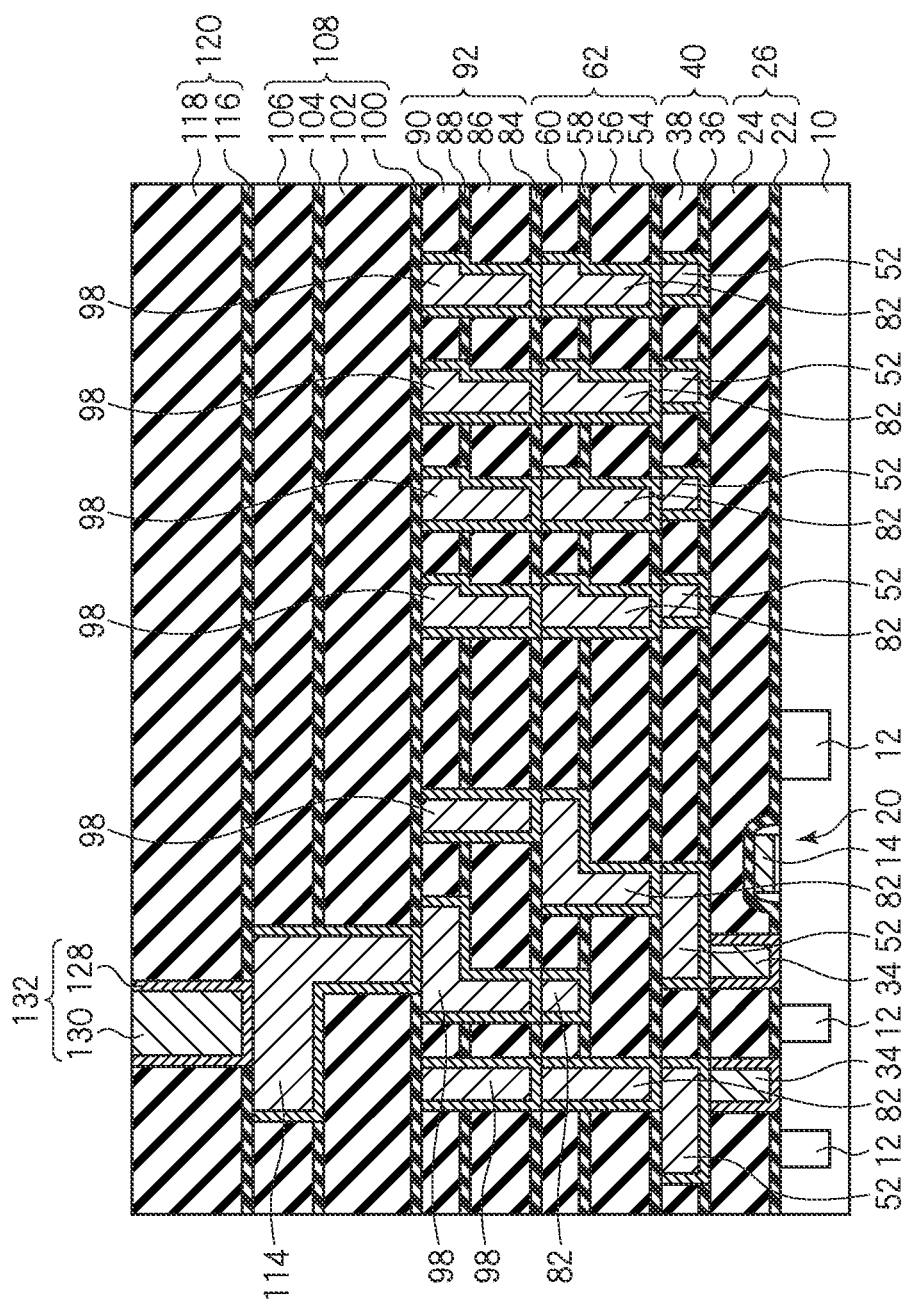

Next, the tungsten film 130 and the barrier metal 128 above the inter-layer insulating film 120 are removed by, e.g., CMP method to form the contact plug 132 of the W/TiN structure buried in the via-hole 126 (FIG. 23).

Then, the TiN film 134, the AlCu film 136 and the TiN film 138 are sequentially deposited by, e.g., sputtering method over the inter-layer insulating film 120 with the contact plug 132 buried in.

Figure 24:
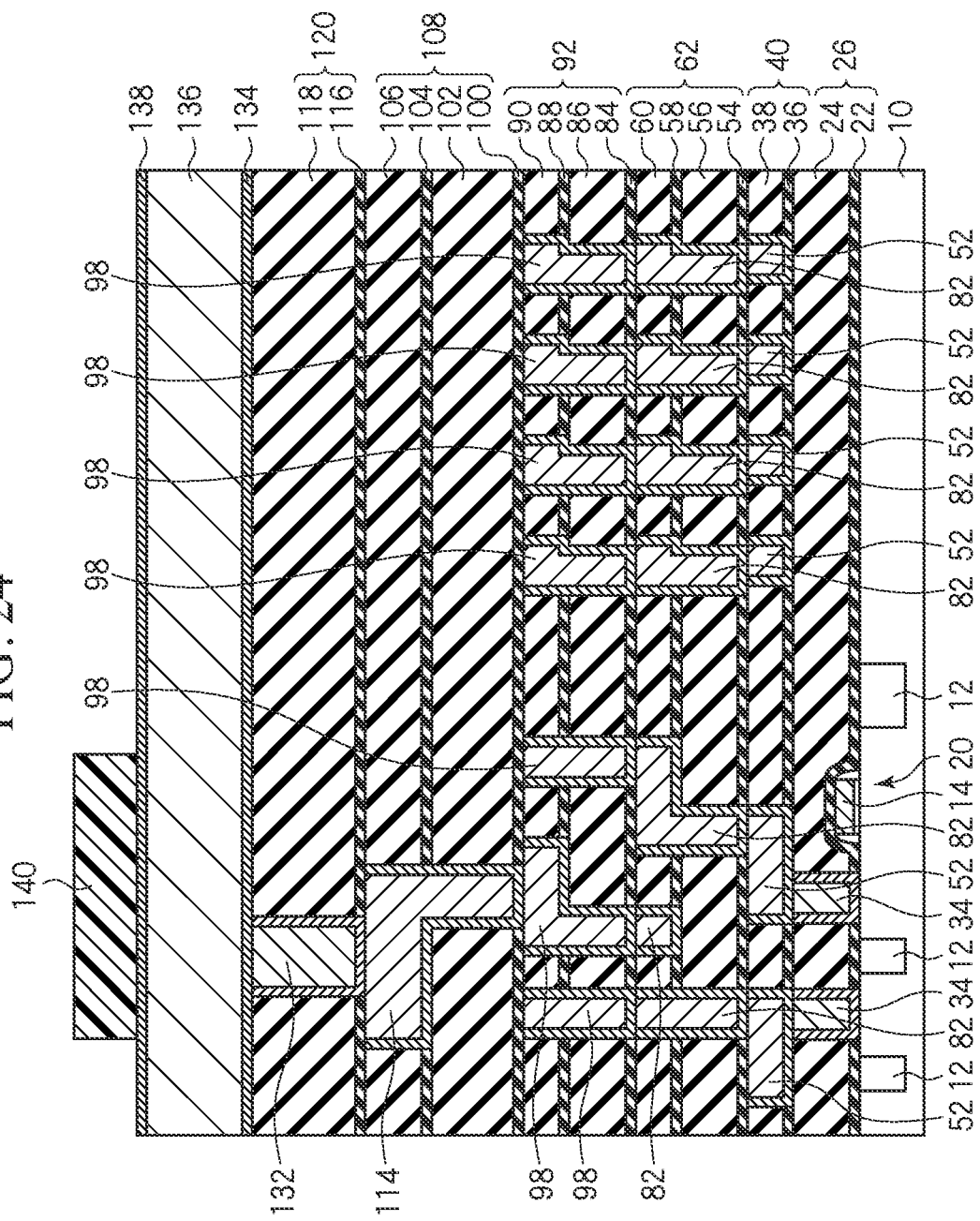

Next, a photoresist film 140 having patterns of the interconnections to be connected to the contact plug 132 is formed on the TiN film 138 by photolithography (FIG. 24).

Then, the TiN film 138, the AlCu film 136 and the TiN film 134 are anisotropically etched with the photoresist film 140 as the mask to form the interconnection layer 142 of the TiN/AlCu/TiN structure.

Figure 25:
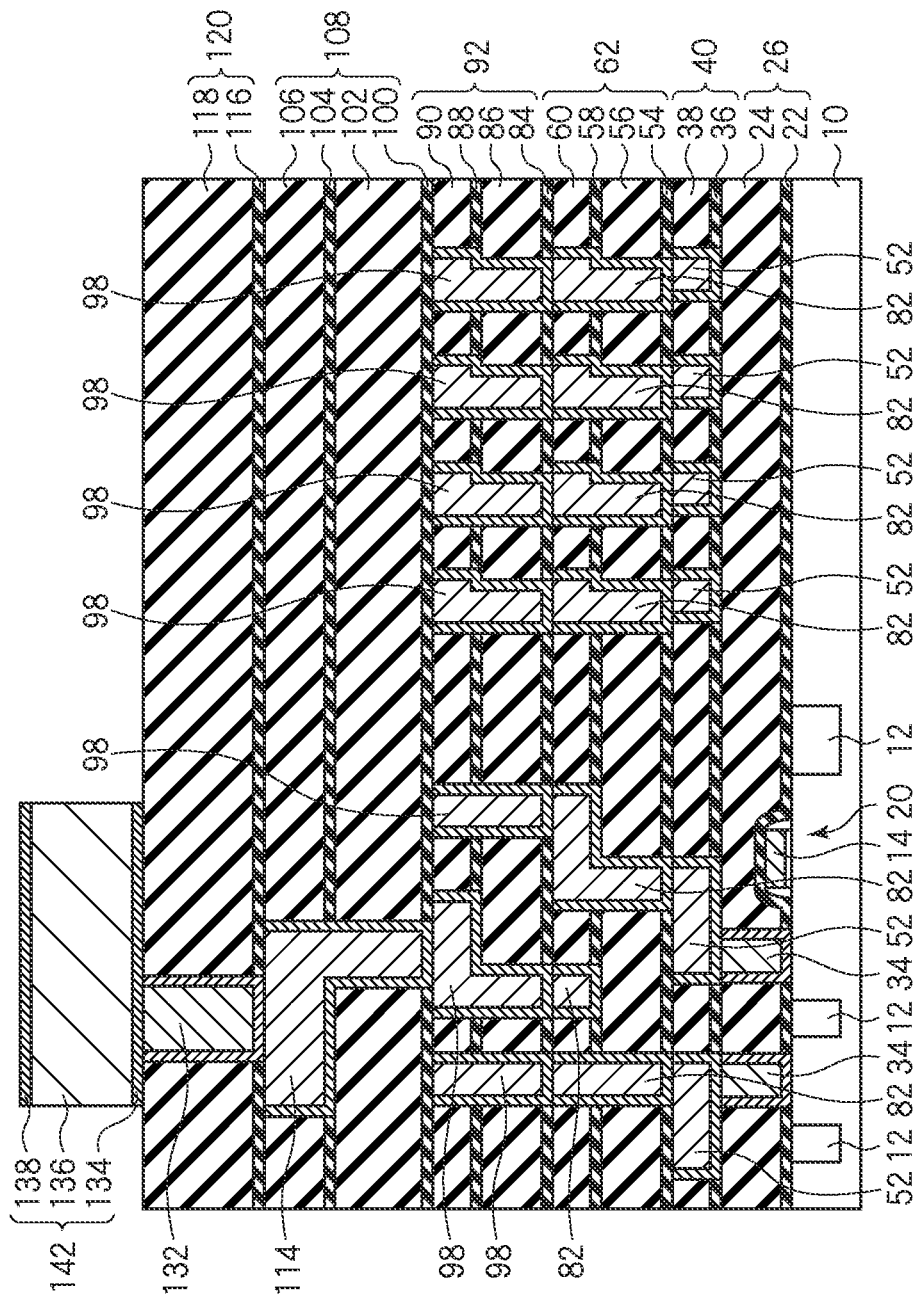

Then, the photoresist film 140 is removed by, e.g., asking (FIG. 25)

Figure 26:
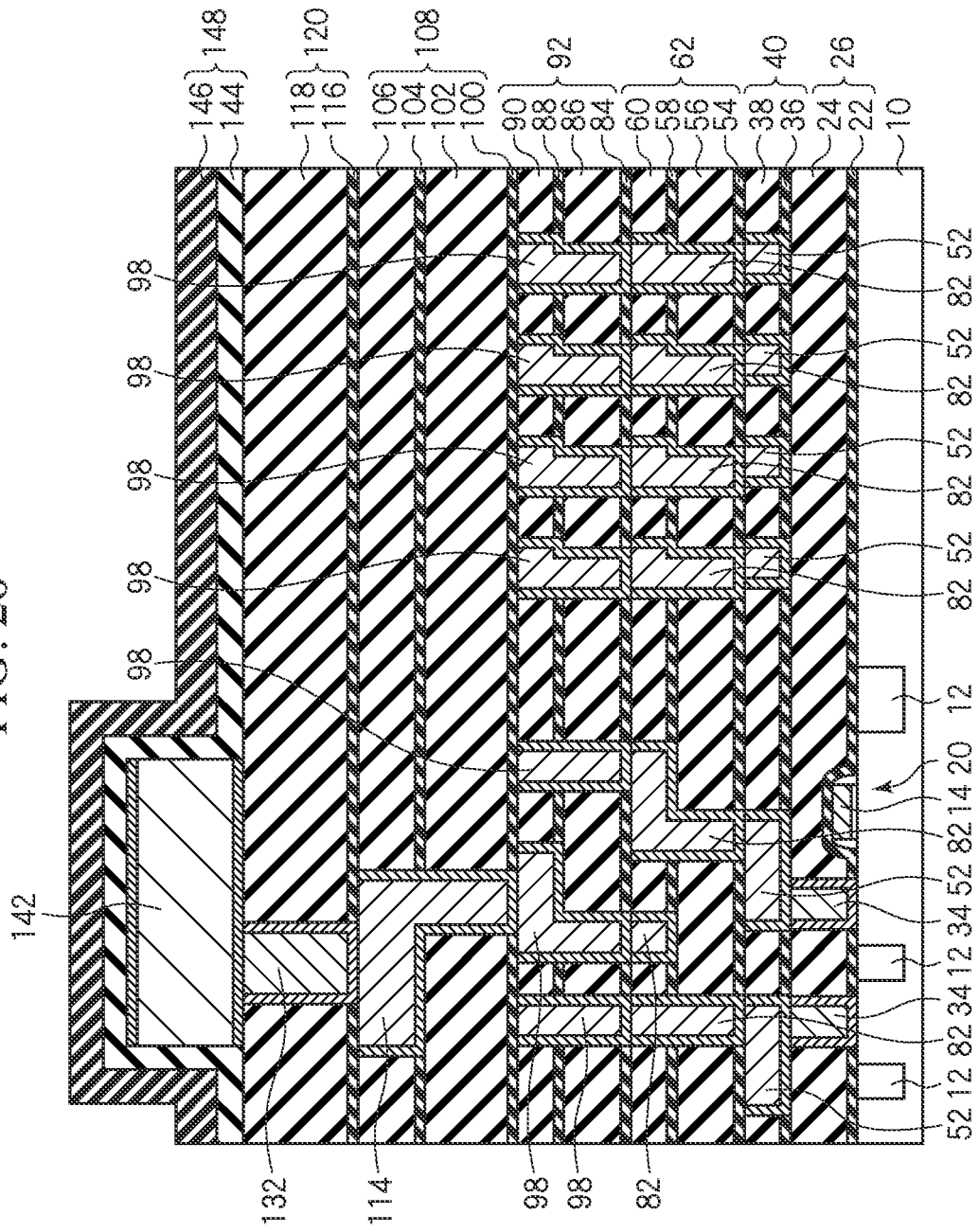

Next, the silicon oxide film 144 and the silicon nitride film 146 are formed by, e.g., CVD method over the inter-layer insulating film 120 with the interconnection layer 142 formed on. Thus, the cover film 148 of the SiN/SiO$_2$ structure is formed on the inter-layer insulating film 120 (FIG. 26).

Figure 27:
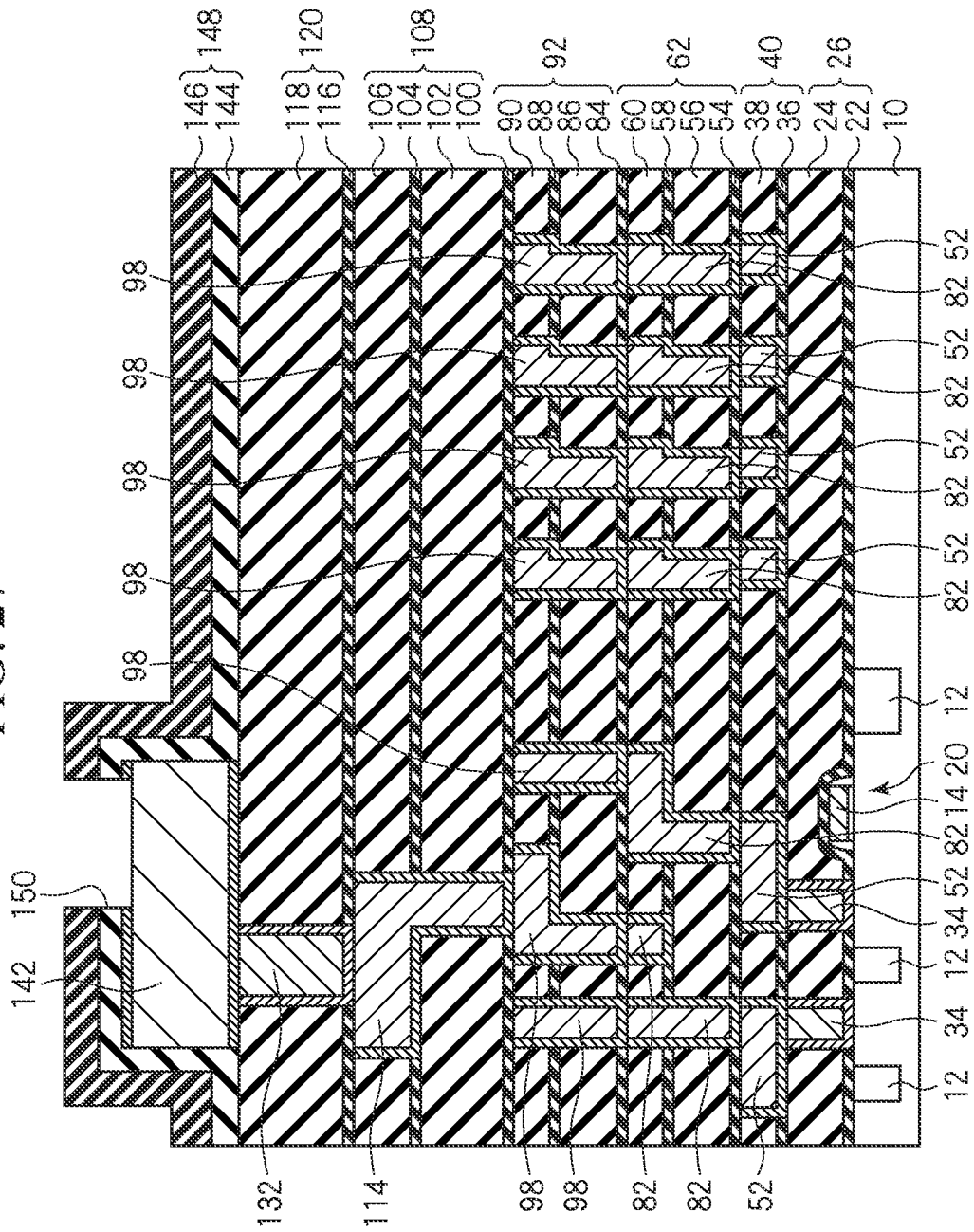
Figure 28:
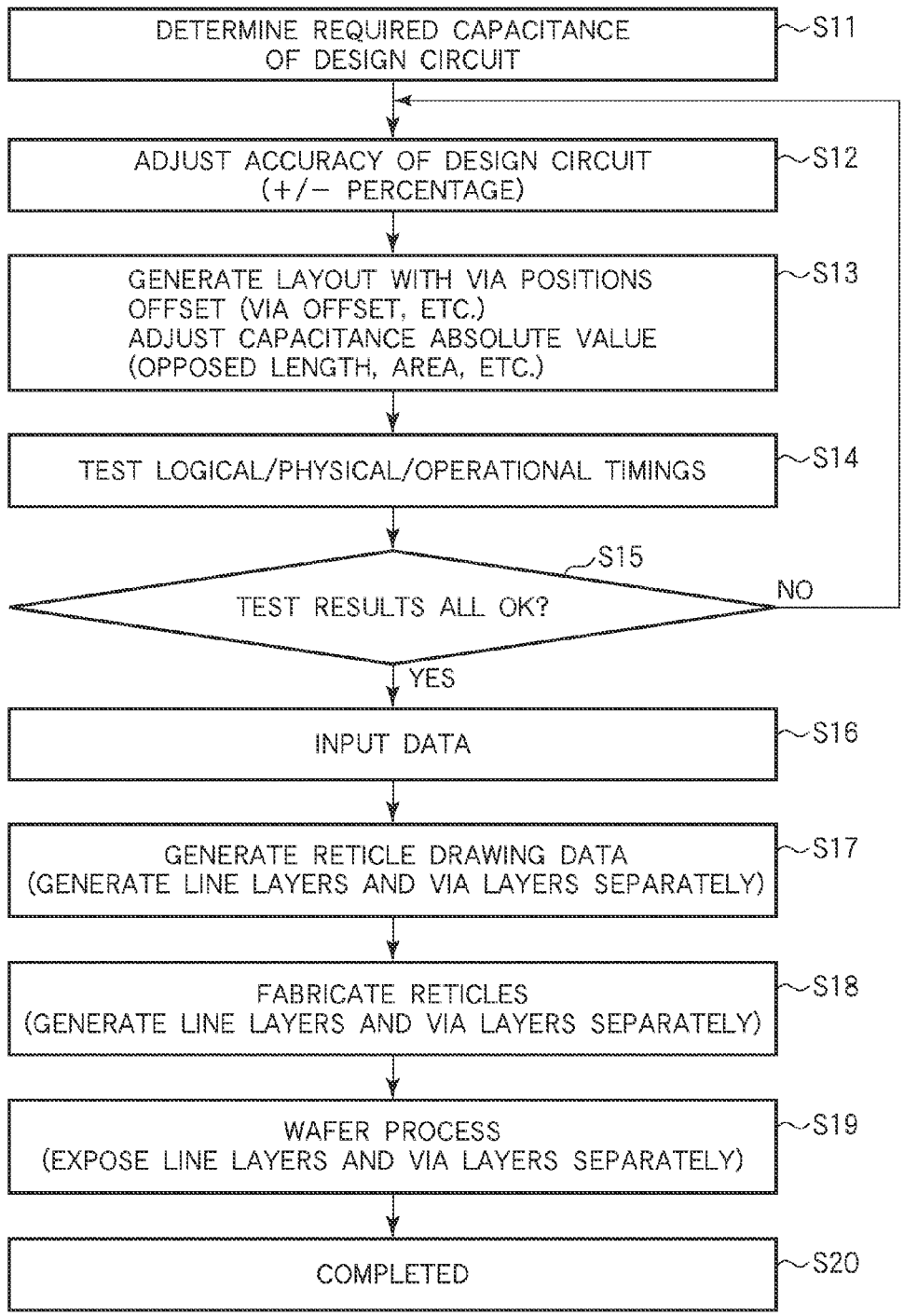
FIG. 28 is a flow chart illustrating a method of designing the semiconductor device according to the first embodiment.

Then, the pad opening 150 for exposing the interconnection layer 142 is formed in the cover film 148 by photolithography and dry etching (FIG. 27).

Thus, the semiconductor device according to the present embodiment is completed.

Next, the method of preparing reticles for manufacturing the semiconductor device according to the present embodiment will be described with reference to FIG. 28.

First, a required capacitance of the design circuit is decided (Step S11).

Then, the accuracy of the design circuit (what ±% of accuracy is necessary) is adjusted (Step S12).

Next, the offset amount of the via-holes from the electrode patterns is decided, and a layout having the positions of the via-holes offset from the electrode patterns is generated. At this time, the via-holes in the interconnection capacitor part are offset selectively from the electrode patterns, and the via-holes in the ordinary circuit part are not intentionally offset from the interconnection patterns. The opposed length, the area, etc. of the electrode patterns are set to adjust the capacitance absolute value (Step S13).

Then, based on the data given in Step S13, the logical/physical/operational timings are tested (Steps S14-S15).

The test result is OK, the data is inputted (Step S16). When the test result is NG, the processing returns to Step S12, and data are regenerated.

Thus, the offset amount of the via-holes from the electrode patterns, the opposed length and the area of the electrode patterns, etc. for realizing the required capacitance of the design circuit are set.

Then, based on the inputted data, reticle drawing data are generated (Step S17). At this time, the line layers and the via layers are separately generated.

Next, based on the reticle drawing data generated in Step S17, reticles are formed (Step S18). At this time, the line layers and the via layers are separately formed.

Next, based on the thus-prepared reticles, the wafer process described above with reference to FIGS. 4A to 27 is made (Step S19), and the semiconductor device according to the present embodiment is completed (Step S20).

As described above, according to the present embodiment, the via-holes interconnecting the upper and the lower electrode patterns are laid out, offset from the centers of the electrode patterns, whereby even when the electrode patterns and the via holes are processed in minimum processing dimensions decided by the design rules, the capacitance of the capacitor can be increased.

A Second Embodiment

A semiconductor device and a method of manufacturing the same according to a second embodiment will be described with reference to FIGS. 29 to 41. The same members of the present embodiment as those of the semiconductor device and the method of manufacturing the same according to the first embodiment are represented by the same reference numbers not to repeat or simplify their description.

Figure 29:
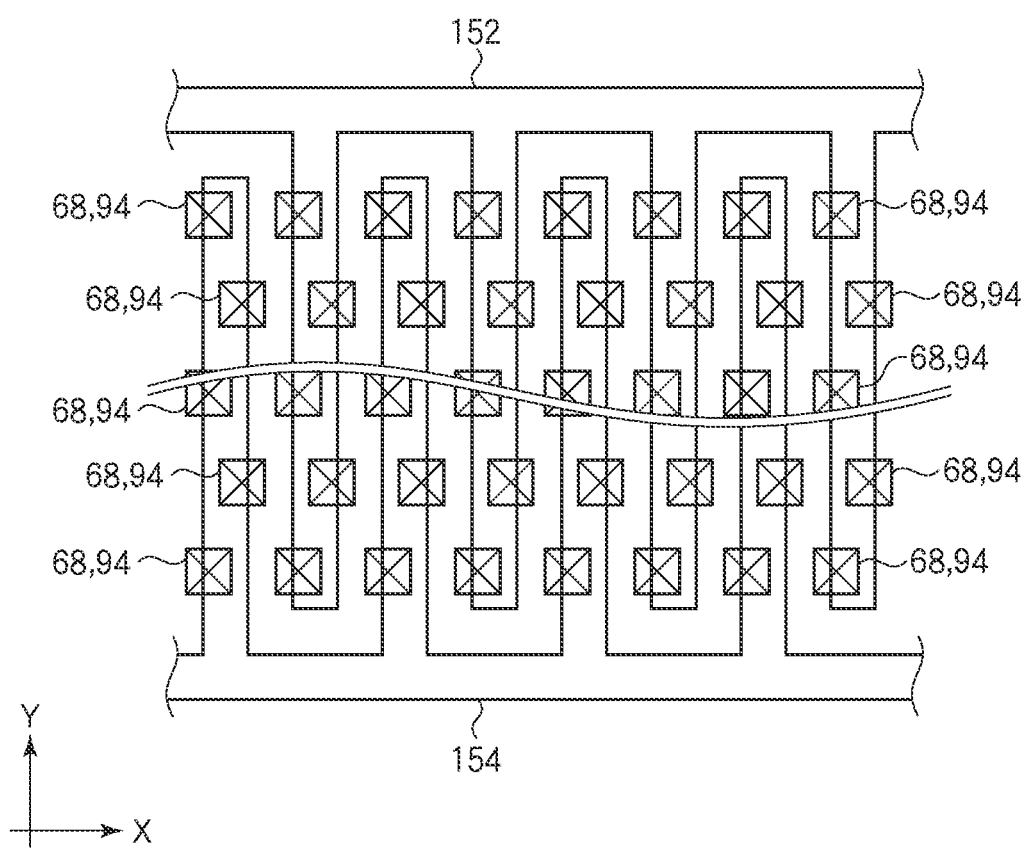
FIGS. 29 and 30A are plan views illustrating a structure of a semiconductor device according to a second embodiment.
Figure 30A:
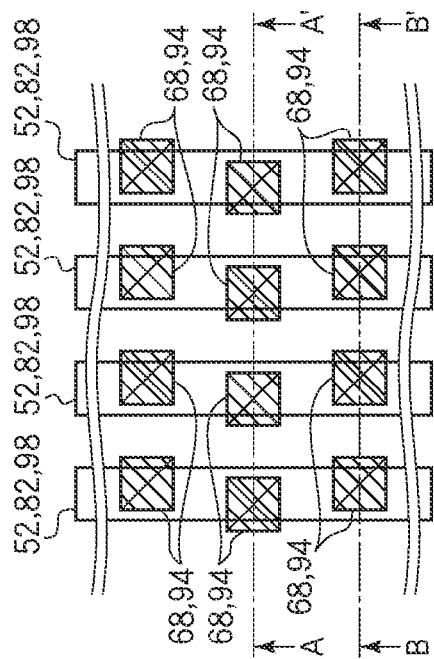
Figure 30B:
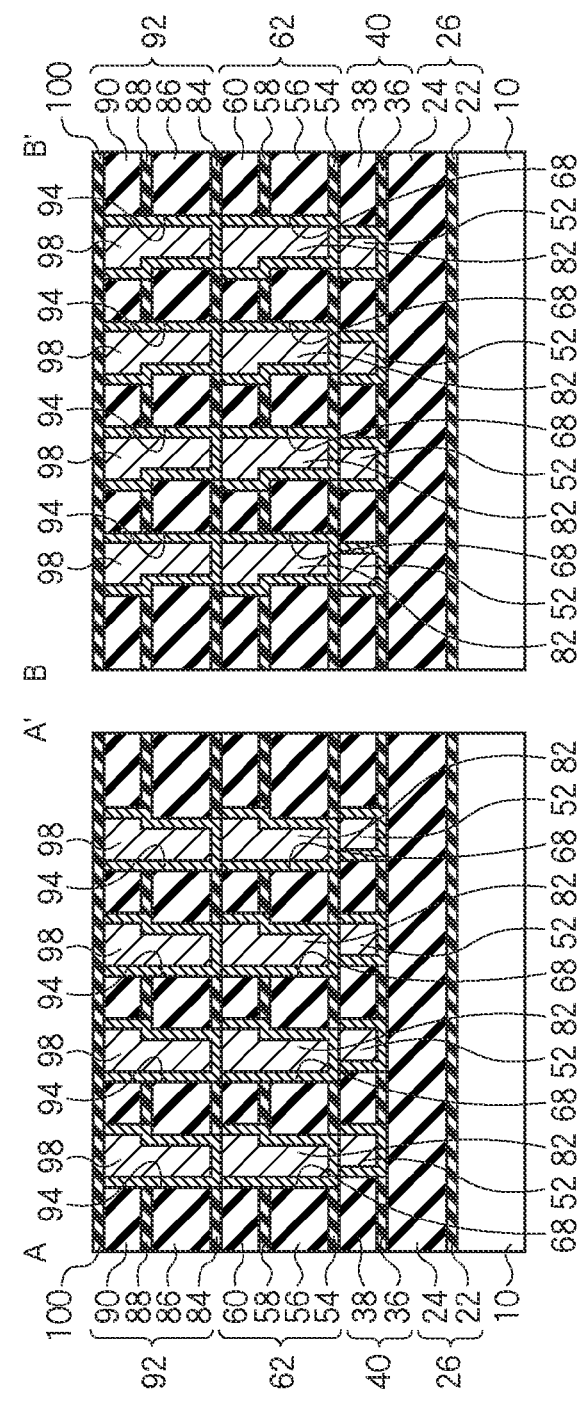
FIG. 30B is a diagrammatic cross-sectional view illustrating the structure of the semiconductor device according to the second embodiment.
Figure 31A:
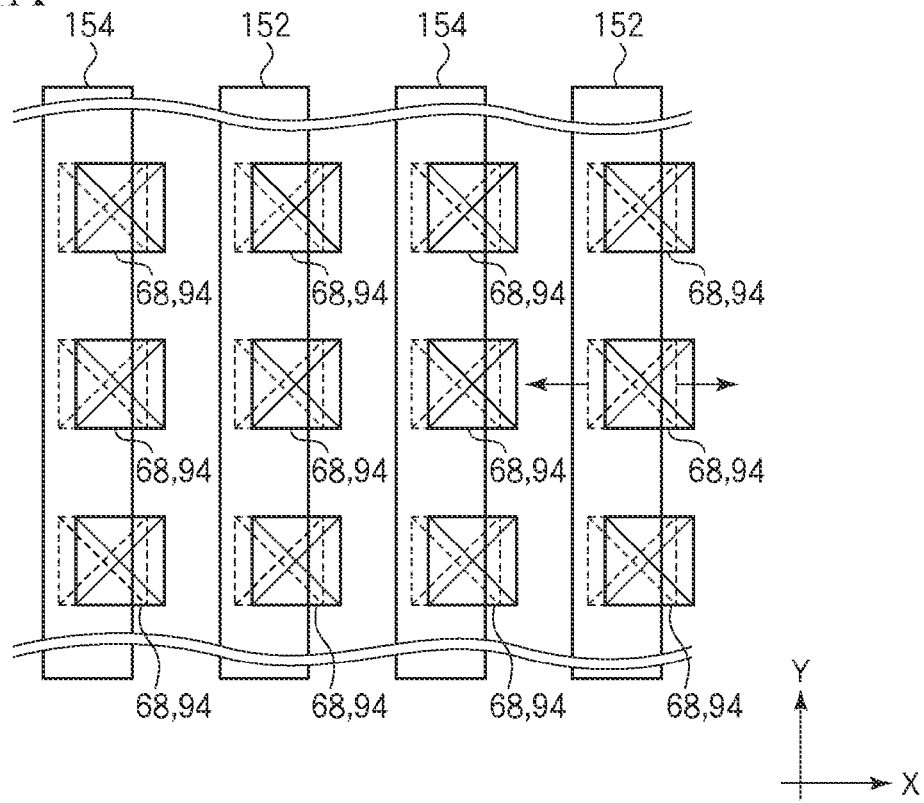
FIGS. 31A and 31B are plan views explaining a positioning error of the via-holes from the electrode patterns in the photolithography.
Figure 31B:
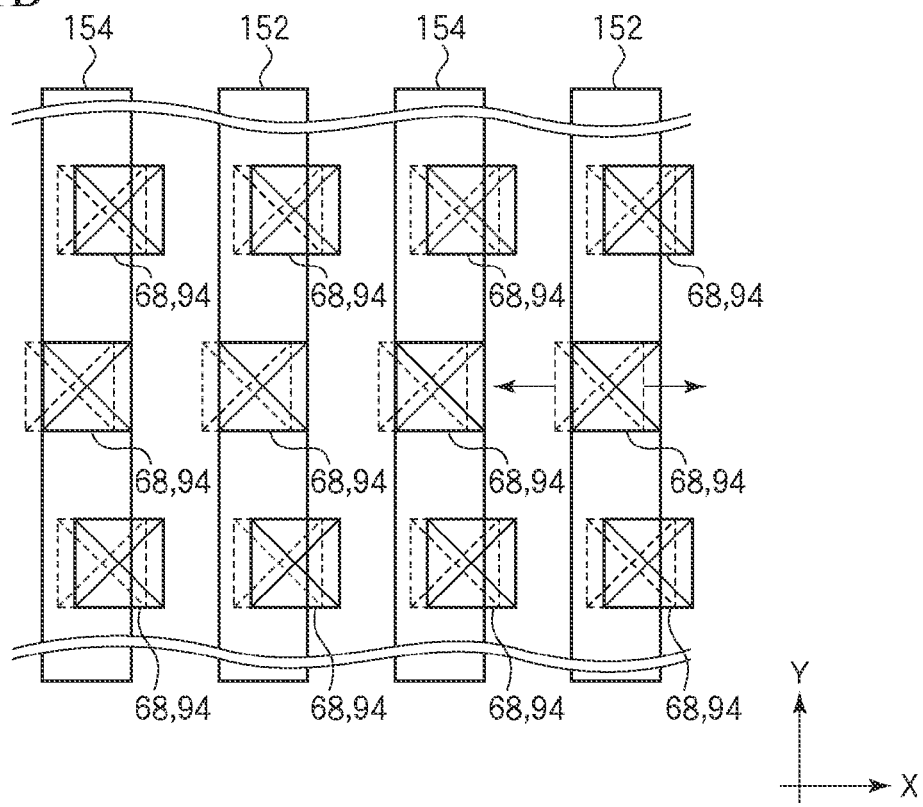
Figure 32A:
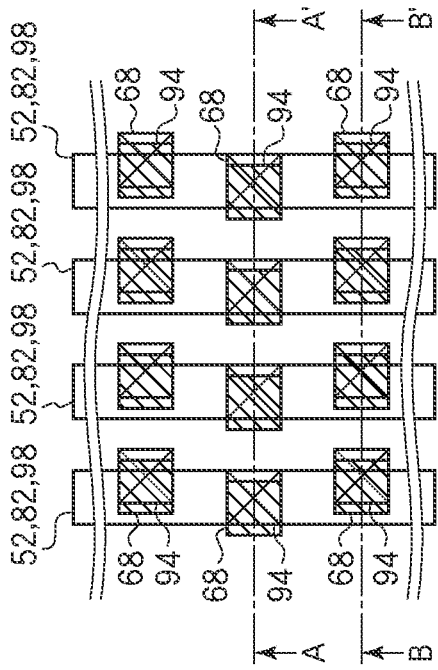
FIG. 32A is a plan view illustrating a structure of the semiconductor device with a positioning error of the via-holes from the electrode patterns.
Figure 32B:
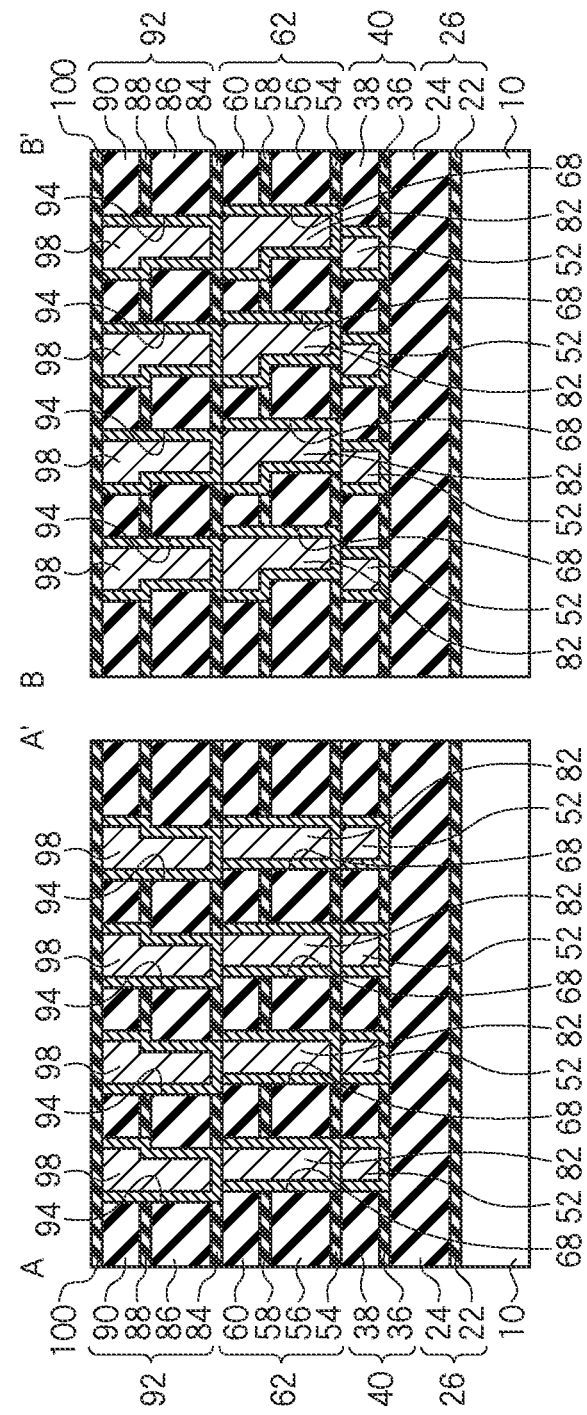
FIG. 32B is a cross-sectional view illustrating a structure of the semiconductor device with the positioning error of the via-holes from the electrode patterns.
Figure 33:
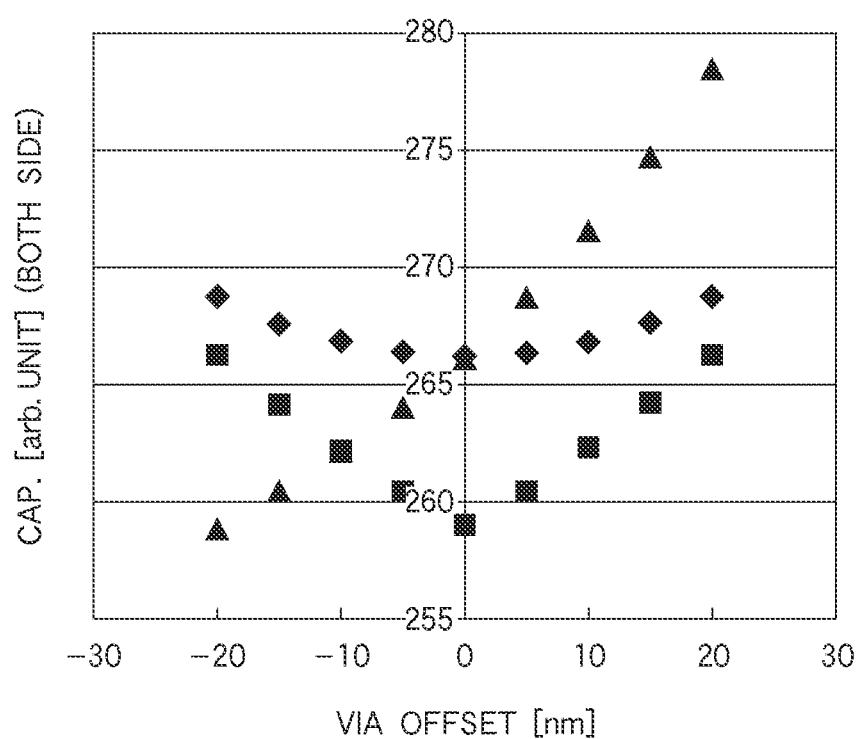
FIG. 33 is a graph illustrating relationships between positioning error amounts of the via-holes from the electrode patterns and the capacitance of the interconnection capacitor, which were given by simulation.

FIGS. 29 and 30A are plan views illustrating a structure of the semiconductor device according to the present embodiment. FIG. 30B is a diagrammatic cross-sectional view illustrating the structure of the semiconductor device according to the present embodiment. FIGS. 31A and 31B are plan views explaining a positioning error of the via-holes from the electrode patterns in the photolithography. FIGS. 32A and 32B are a plan view and a cross-sectional view illustrating the structure of the semiconductor device with a positioning error of the via-holes from the electrode patterns. FIG. 33 is a graph illustrating relationships between positioning error amounts of the via-holes from the electrode patterns and the capacitance of the interconnection capacitor, which were given by simulation. FIGS. 34-41 are plan views illustrating the structures of the semiconductor devices according to modifications of the present embodiment.

First, the structure of the semiconductor device according to the present embodiment will be described with reference to FIG. 29.

The semiconductor device according to the present embodiment is the same as the semiconductor device according to the first embodiment illustrated in FIG. 1 except that the layout of via-holes 68, 94 of the present embodiment is different from that of the first embodiment.

The electrode patterns of the respective interconnection layers 52, 82, 98 are laid out, as exemplified in FIG. 3A, overlaid over each other as viewed in plane. As exemplified in FIG. 3B, the interconnection layer 52 and the interconnection layer 82 are electrically connected to each other via the via-holes 68, and the interconnection layer 82 and the interconnection layer 98 are electrically connected to each other via the via-holes 94.

Here, in the semiconductor device according to the present embodiment, the via-holes 68 interconnecting the interconnection layer 52 and the interconnection layer 82, and the via-holes 94 interconnecting the interconnection layer 82 and the interconnection layer 98 are laid out, offset from the centers of the comb-shaped electrode patterns 152, 154. The direction in which the via-holes 94 are offset is two directions intersecting the extending direction of the electrode patterns 152, 154. When the comb teeth of the electrode patterns 152, 154 are formed, extended in the Y direction as exemplified in FIG. 29, the centers of the via-holes 68, 94 are laid out, offset from the centers of the electrode patterns 152, 154, where the centers of the via-holes 68 would be ordinarily laid out, in the +X direction or the −X direction.

As exemplified in FIGS. 30A and 30B, the via-holes 68, 94 are offset from the interconnections 52, 82, in the −X direction in the A-A' cross section and offset from the interconnections 52, 82, 98 in the +X direction in the B-B' cross section.

On the other hand, in the ordinary circuit part, as exemplified in FIG. 3A, the via-holes 68, 94 are laid out, positioned at the centers of the electrode patterns of the interconnection layers 52, 82, 98, as in the layout of the general electrode patterns.

In the semiconductor device according to the present embodiment, the via-holes 68, 94 are offset from the centers of the electrode patterns 152, 154 so that, as in the first embodiment, the capacitance per a unit area of the interconnection capacitor can be increased. Even with the layout of the via-holes 68, 94 offset in the two directions of the +X direction and the −X direction, the effect of increasing the capacitance per a unit area of the interconnection capacitor is the same as in the first embodiment.

Additionally, in the semiconductor device according to the present embodiment, the via-holes 68, 94 are offset in the two directions (+X direction and −X direction) intersecting the extending direction (Y direction) of the electrode patterns, whereby the fluctuations of the capacitance of the interconnection capacitor can be suppressed.

It is assumed that the positioning error takes place in the X direction in the photolithography step for forming the via-holes 68, 94, when the via-holes 68, 94 are offset in the two directions of the +X direction and the −X direction.

The positioning error of the via-holes in the photolithography is the states illustrated exemplified in FIGS. 31A and 31B. FIG. 31A illustrates the state that the via-holes are offset from the electrode patterns in either of the +X direction and the −X direction (the +X direction in the drawing) in the mask layout (the first embodiment). FIG. 31B illustrates the state that the via-holes are offset from the electrode patterns in the two directions of the +X direction and the −X direction in the mask layout (the present embodiment). In the drawings, the dotted line indicates the positions of the via-holes 68, 94 without the positioning error in the photolithography.

FIGS. 32A and 32B are a plan view and a diagrammatic cross-sectional view illustrating the state that the via-holes 68 of the via-holes 68, 94 are offset in the +X direction.

When the +X directional positioning error takes place along the X axis, the via-holes 68 offset in the +X direction are formed nearer the adjacent electrode patterns. Resultantly, the line width of the electrode patterns in the regions where the via-holes 68 are formed becomes larger, and the distance with respect to the adjacent electrode patterns becomes smaller (refer to the B-B' line cross-sectional view of FIG. 32B). That is, the capacitance between the via-holes 68 offset in the +X direction and the adjacent electrode patterns is increased.

On the other hand, the via-holes 68 offset in the −X direction are formed farther from the adjacent electrode patterns. Resultantly, the line width of the electrode patterns in the regions where the via-holes 68 are formed becomes smaller, and the distance with respect to the adjacent electrode patterns becomes larger (refer to the A-A' line cross-sectional view of FIG. 32B). That is, the capacitance between the via-holes 68 offset in the −X direction and the adjacent electrode patterns is decreased. Resultantly, the capacitance increasing effect and the capacitance decreasing effect compensate each other, and as a whole, the fluctuations of the capacitance can be made small.

Opposite to this, when the positioning error takes place in the −X direction along the X axis, the via-holes 68 offset in the +X direction are formed farther from the adjacent electrode patterns. That is, the capacitance between the via-holes 68 offset in the +X direction and the adjacent electrode patterns is decreased. The via-holes offset in the −X direction are formed nearer the adjacent electrode patterns. That is, the capacitance between the via-holes 68 offset in the −X direction and the adjacent electrode patterns is increased. Resultantly, the capacitance increasing effect and the capacitance decreasing effect compensate each other, and as a whole, the scatter of the capacitance value can be made small.

FIG. 33 is a graph of the relationships between the positioning error amounts of the via-holes 68, 94 with the electrode patterns and the capacitance of the interconnection capacitor given by simulation. The horizontal axis represents the positioning error amount of the via holes 68, 94 from the electrode patterns in the photolithography (via offset). The vertical axis represents the capacitance of the interconnection capacitor formed on both sides of one electrode pattern.

In the graph, the ■ mark indicates that the offset amount of the via-holes from the electrode patterns on the mask layout is 0 (a Control). The ▲ mark indicates that the via-holes are laid out, offset from the electrode patterns on the mask layout (the first embodiment). The ♦ mark indicates that the via-holes are laid out, offset from the electrode patterns in two directions of the +X direction and the −X direction on the mask layout (the present embodiment).

In the simulation of FIG. 33, the line and space (L/S) of the electrode patterns was 0.20 μm/0.20 μm, and the width of the via-holes was 0.20 μm. In the samples having the via-holes offset from the electrode patterns on the mask layout (indicated by the ▲ mark and the ♦ mark), the offset amount of the via-holes from the electrode patterns on the mask layout was 20 nm.

As shown in FIG. 33, it has been found that without lithographic positioning error, the samples having the via-holes offset from the electrode patterns (indicated by the ▲ mark and the ♦ mark) can increase the capacitance in comparison with the sample having the via holes laid out, not offset from the electrode patterns (indicated by the ■ mark).

Concerning the change of the capacitance due to the positioning error, it has been found that the sample having the via-holes laid out, not offset from the electrode patterns (indicated by the ■ mark) and the sample having the via-holes offset from the electrode patterns in one direction (indicated by the ▲ mark) had large changes of the capacitance due to changes of the positioning error amount, but the sample having the via-holes laid out, offset from the electrode patterns in two directions (indicated by the ♦ mark) had very small changes of the capacitance due to changes of the positioning error amount.

In the examples of the semiconductor device illustrated in FIGS. 29-30B, the via-holes 68, 94 adjacent in the Y direction are each alternately offset in the +X direction and the −X direction but may not be each alternately offset.

Figure 34:
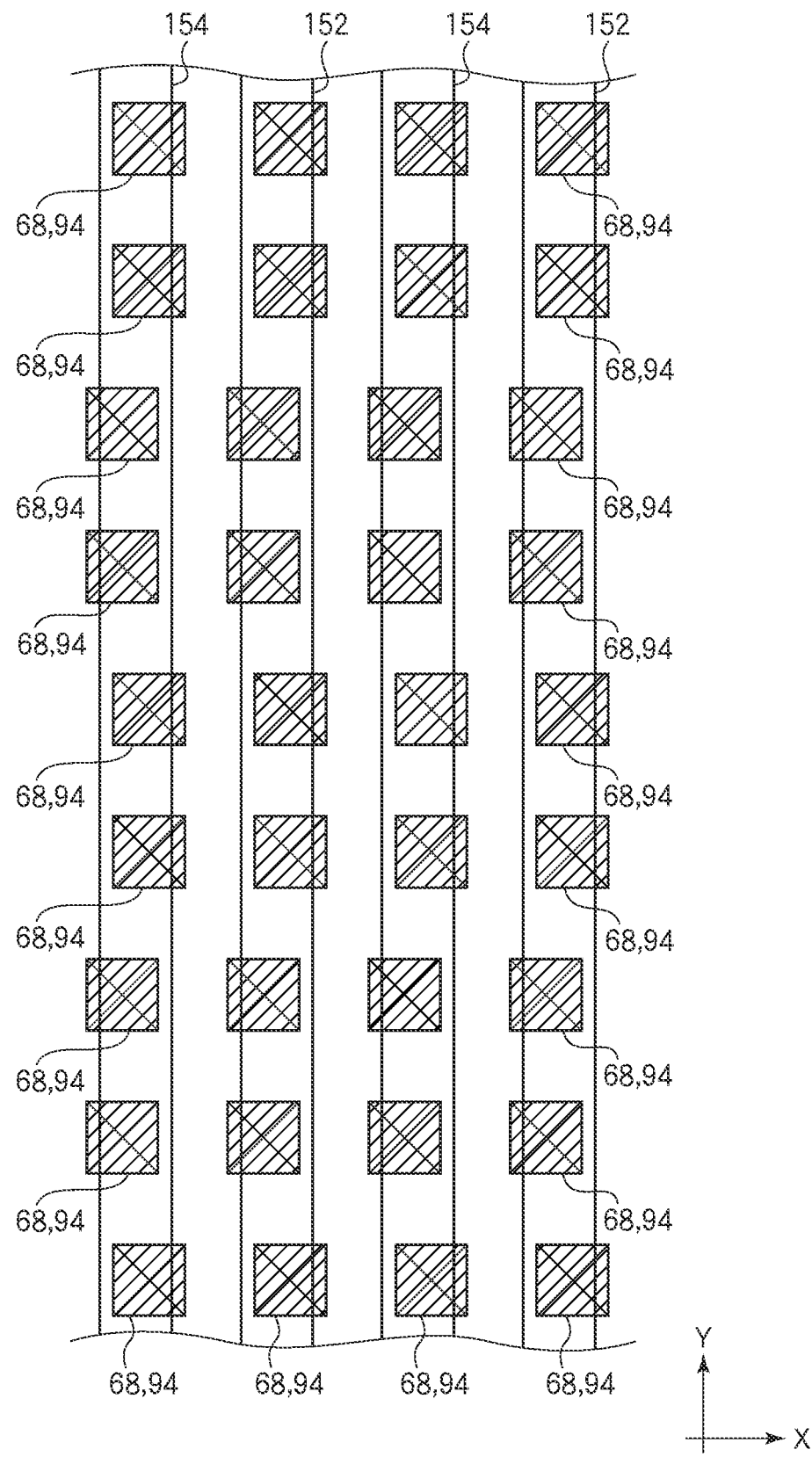
FIGS. 34-41 are plan views illustrating the structures of the semiconductor devices according to modifications of the second embodiment.
Figure 35:
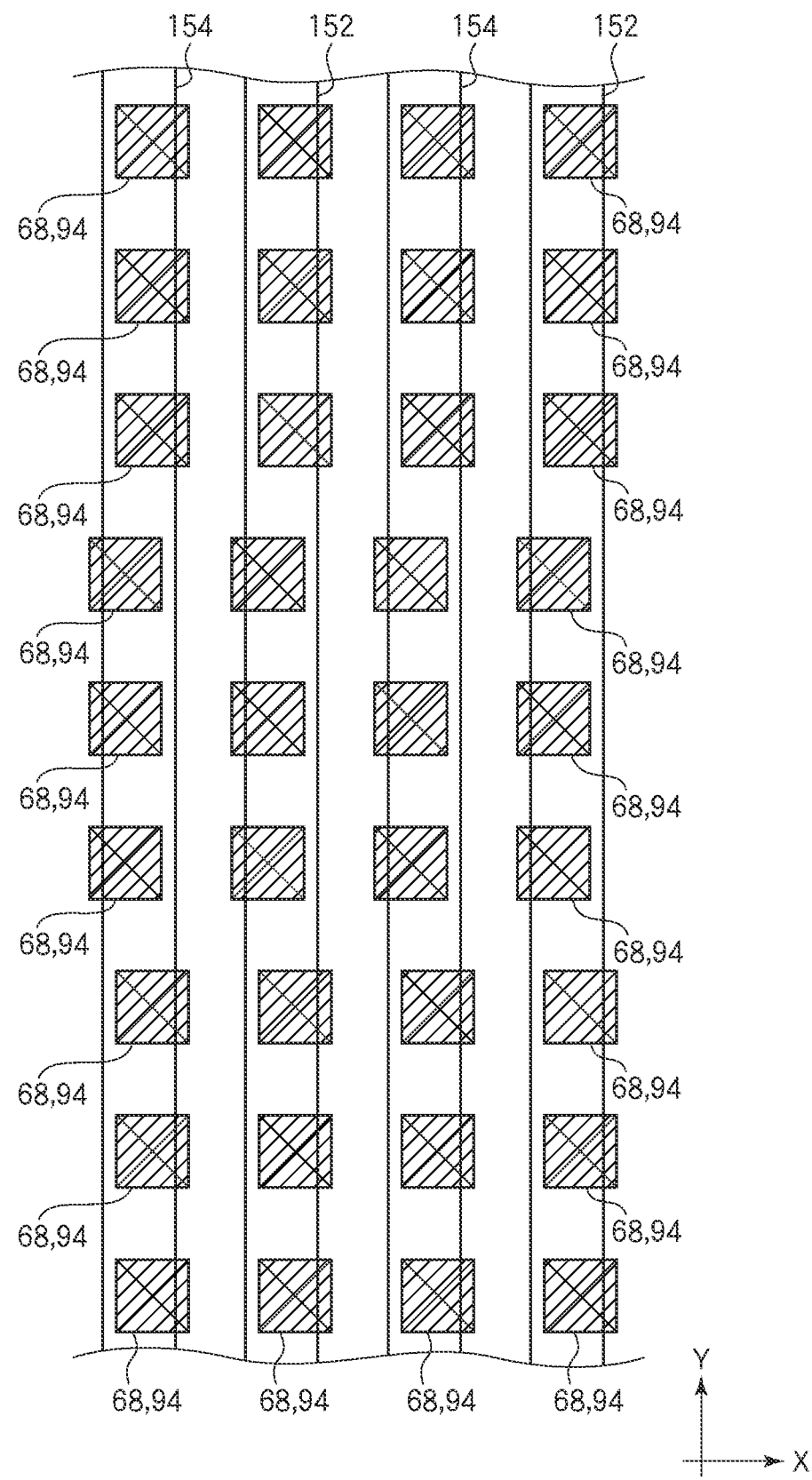
Figure 36:
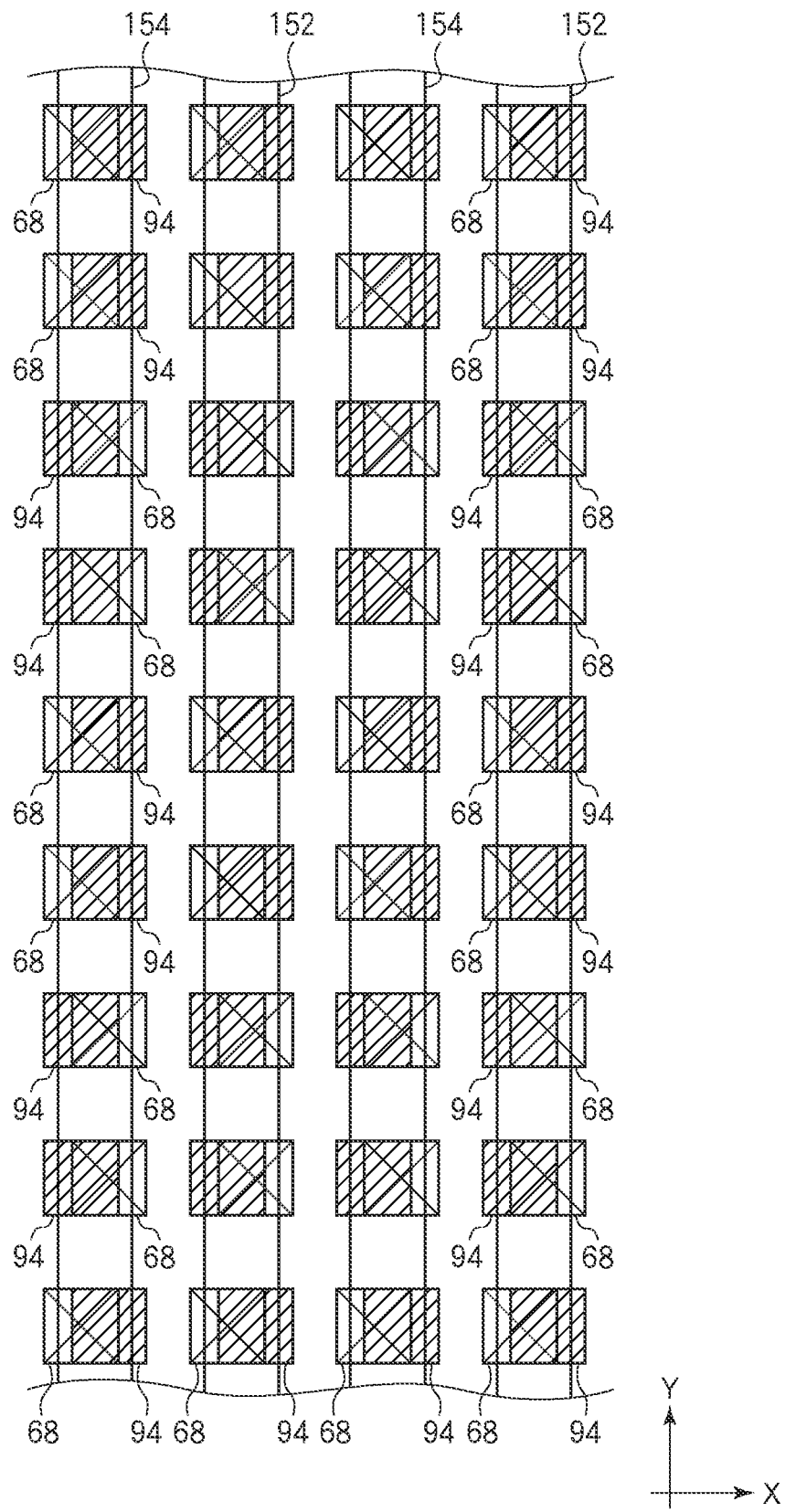
Figure 37:
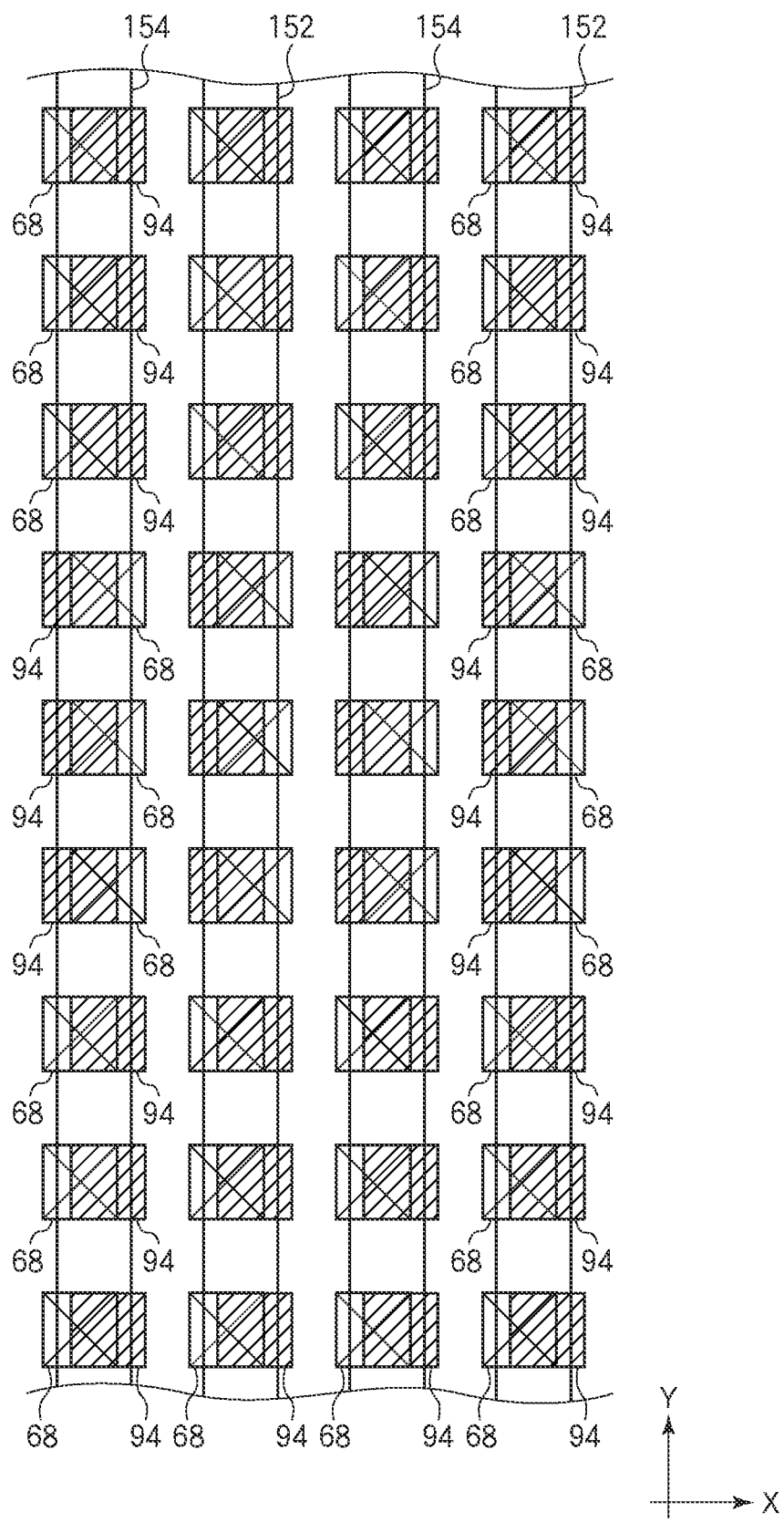

For example, as illustrated in FIG. 34, the via-holes 68, 94 adjacent in the Y direction may be laid out, offset every two via-holes 68, 94 alternately in the +X direction and the −X direction. Other wise, as illustrated in FIG. 35, the via-holes 68, 84 adjacent in the Y direction may be laid out, offset every three via-holes 68, 94 alternately in the +X direction and the −X direction. Four or more via-holes 68, 94 may be laid out, offset alternately in the +X direction and the −X direction.

The via-holes 68, 94 located at the same position may not be offset in the same direction. For example, as illustrated n FIGS. 36 and 37, the via-holes 68, 94 located at the same position may be laid out, offset in different directions. The via-holes 68, 94 adjacent in the Y direction, which are laid out, each alternately offset can be laid out in the same layouts of FIGS. 36 and 37.

Figure 38:
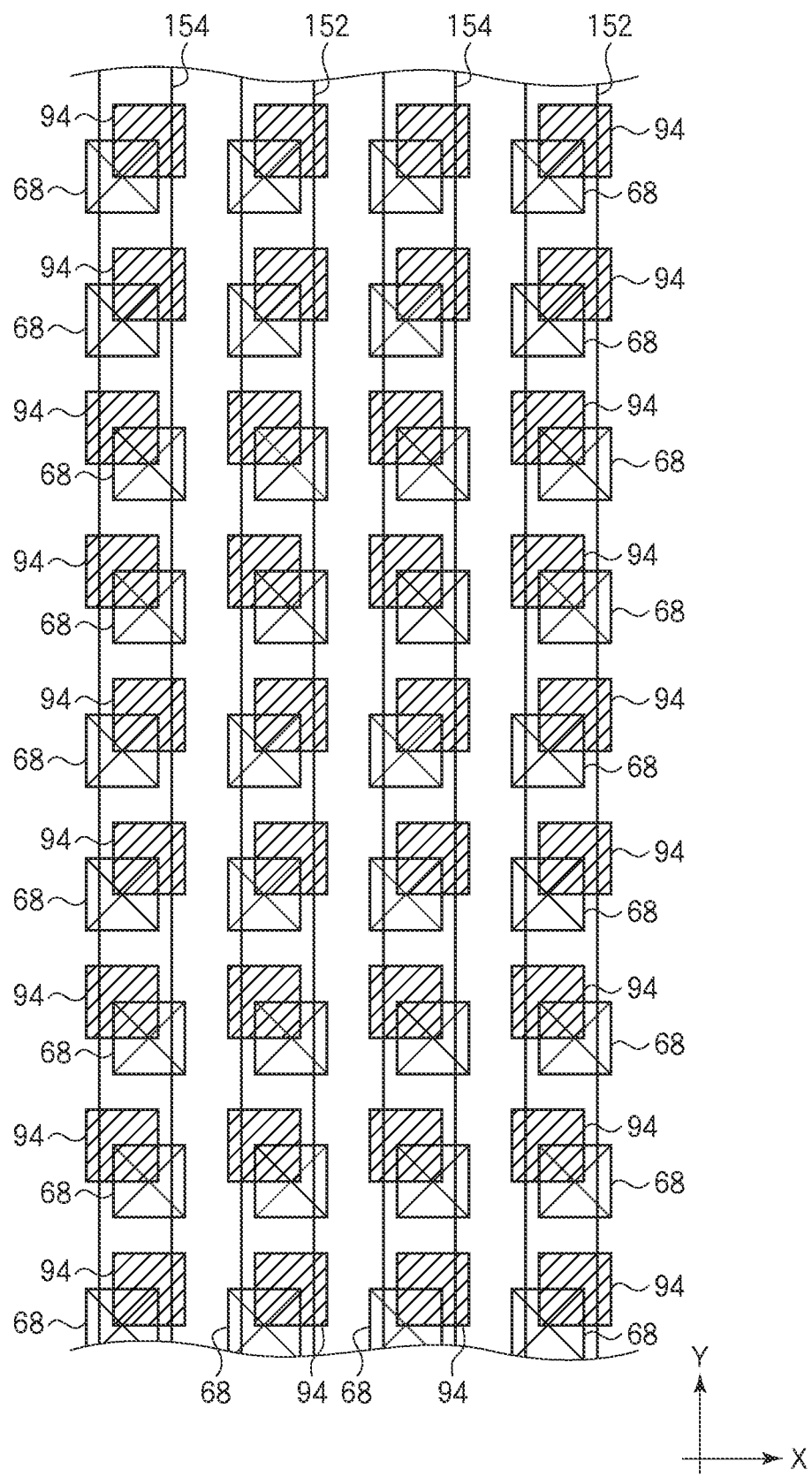
Figure 39:
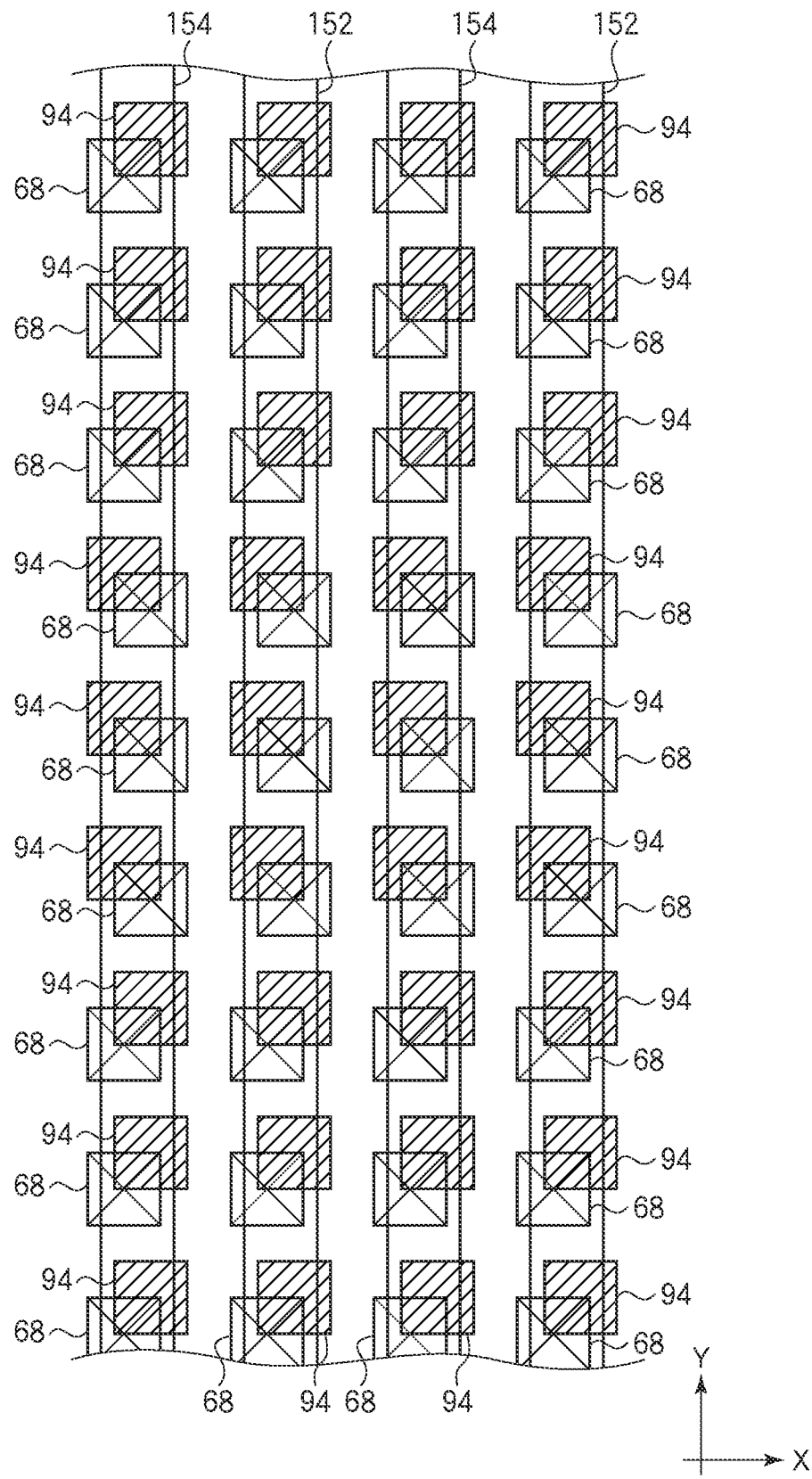
Figure 40:
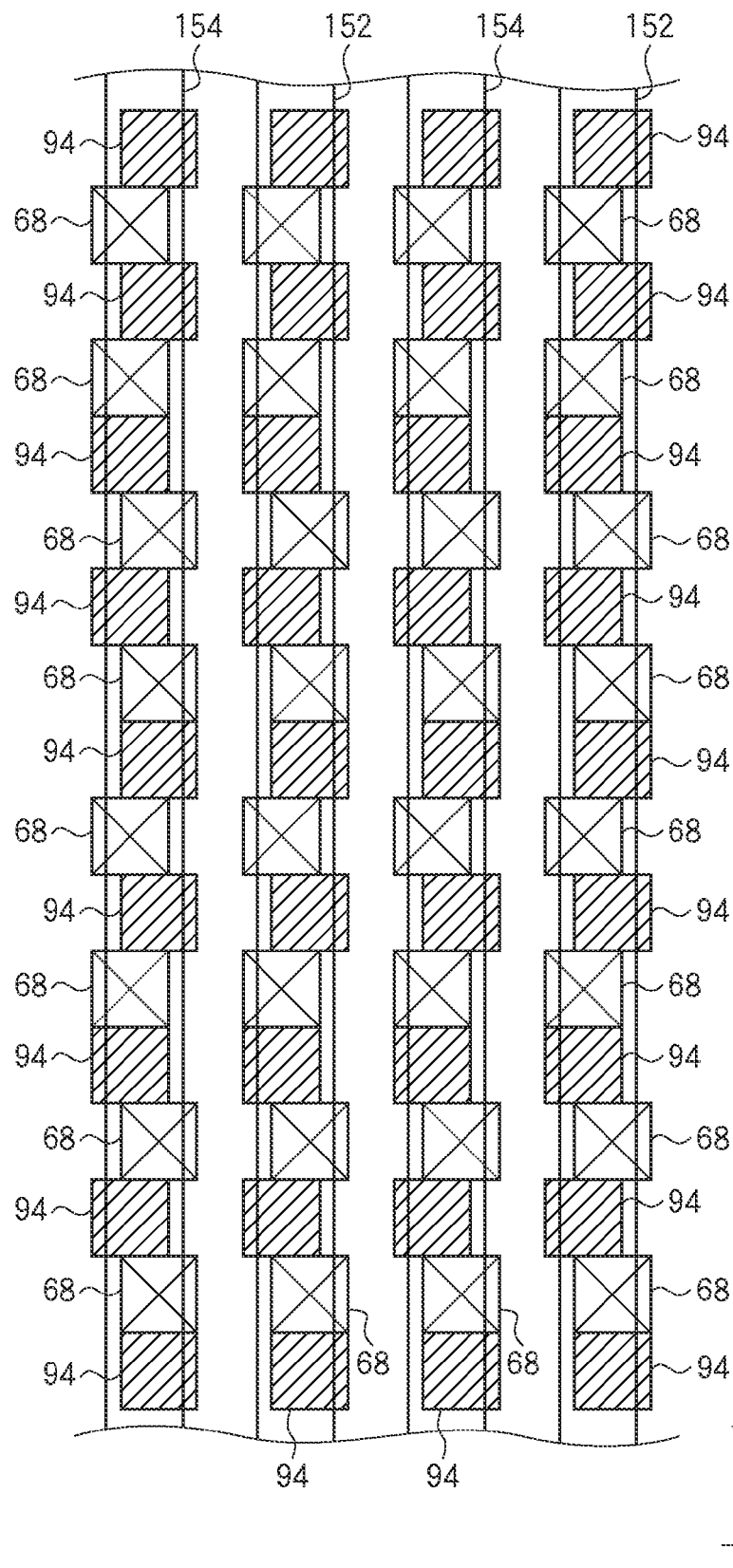
Figure 41:
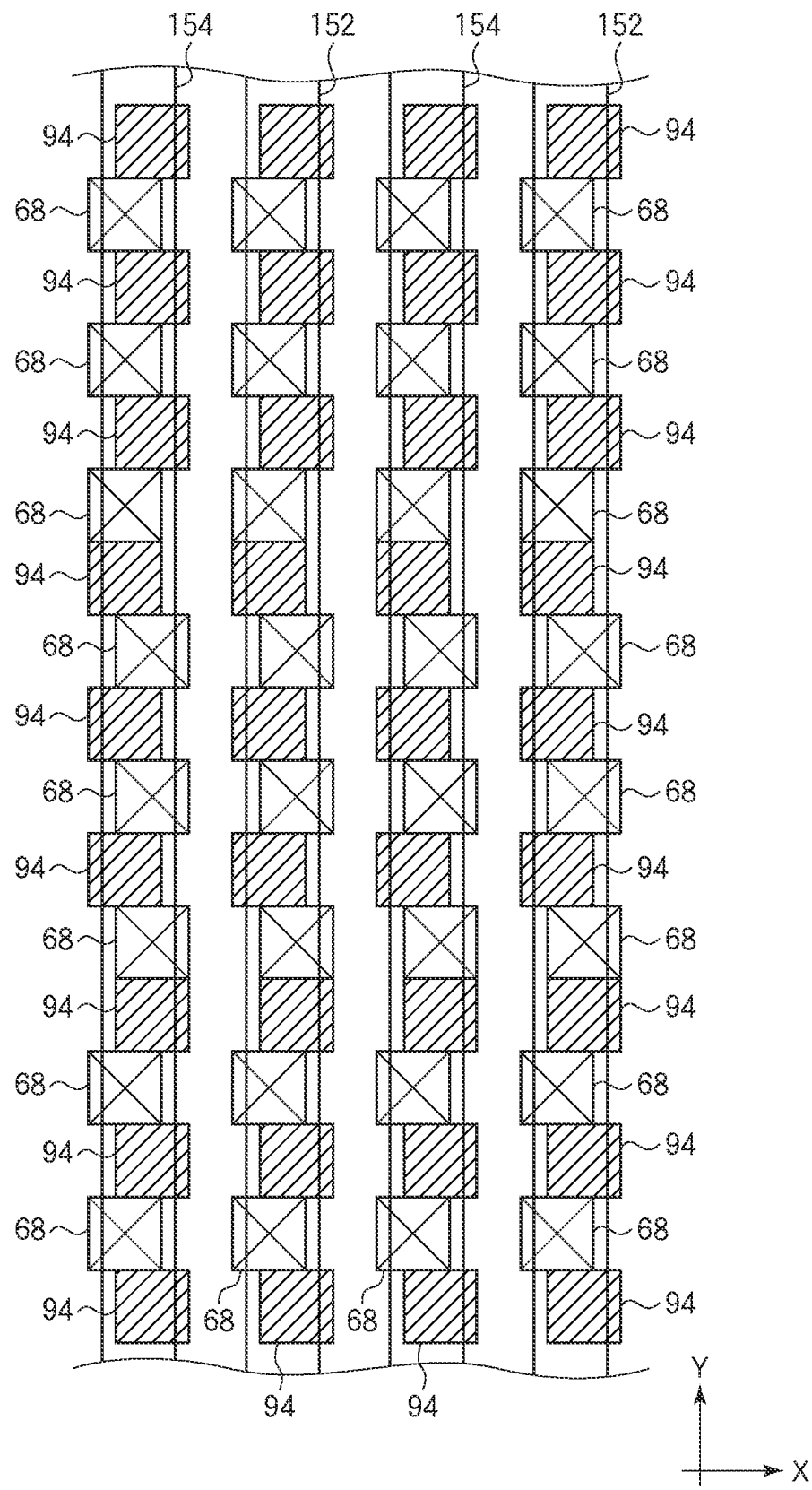

The via-holes 68, 94 may not be located at the same Y-directional position. For example, as illustrated in FIGS. 38-41, the via-holes 68, 94 may be laid out at Y-directional positions different from each other. FIGS. 38 and 39 show the examples of the layout that the via-holes 68, 94 are laid out, offset by a ¼ cycle of the layout cycle of the Y-directional via-holes 68, 94. FIGS. 40 and 41 illustrate the examples that the via-holes 68, are laid out, offset by a ½ cycle of the layout cycle of the Y-directional via-holes 68, 94. When the via-holes 68, 94 adjacent in the Y direction are laid out, each alternately offset, the via-holes 68, 94 can be laid out in the same way as illustrated in FIGS. 38-41.

The method of manufacturing the semiconductor device according to the present embodiment is the same as the method of manufacturing the semiconductor device according to the first embodiment illustrated in FIGS. 4A to 27 except the plane layout of the via-holes 68, 94.

As described above, according to the present embodiment, the via-hole interconnecting the upper and the lower electrode patterns are laid out, offset from the centers of the electrode patterns, whereby even when the electrode patterns and the via-holes are formed in minimum processing dimensions decided by the design rules, the capacitance of the capacitor can be increased. The directions of offsetting the via-holes are divided in two directions intersecting the extending direction of the electrode patterns, whereby the fluctuations of the capacitance due to the positioning error in the lithography can be drastically decreased.

Modified Embodiments

The above-described embodiments can cover other various modifications.

For example, in the above-described embodiments, three layers of the interconnection layers 52, 82, 98 having four electrode patterns are stacked to form the capacitor. However, the number of the electrode patterns and the layer number of the interconnection layers to be stacked are not limited to them. The number of the electrode patterns and the layer number of the interconnection layers to be stacked can be set suitably in accordance with a capacitance, etc. necessary for the capacitor.

In the above-described embodiments, the inter-layer insulating films are formed of, e.g., the layer film of silicon oxide film and silicon nitride film. However, the material forming the inter-layer insulating films is not limited to this, and various inter-layer insulating film structure can be used.

In the above-described embodiments, the patterns of the via-holes are offset from the electrode patterns. However, the electrode patterns may be offset from the patterns of the via-holes. Consequently, the relative positions of the electrode patterns and the patterns of the via-holes are offset from each other. The electrode patterns may be offset or the patterns of the via-holes may be offset, or both may be offset.

In the above-described embodiments, the via parts and the interconnection parts are formed by dual damascene process of forming the interconnection trenches after forming the via-holes. In place of the dual damascene process of forming the interconnection trenches after forming the via-holes, the dual damascene process of forming the via-holes after forming the interconnection trenches can be applied.

What is claimed is:

1. A semiconductor device comprising:
a capacitor including:
a plurality of interconnection layers stacked over each other, the plurality of interconnection layers each including a plurality of electrode patterns extended in a first direction;
a plurality of via parts provided between the plurality of interconnection layers and electrically interconnecting the plurality of the electrode patterns between the interconnection layers adjacent to each other; and
an insulating films formed between the plurality of interconnection layers and the plurality of via parts, wherein
each of the plurality of via parts is laid out, offset from a center of the electrode pattern in a second direction intersecting the first direction,
the plurality of electrode patterns has a larger line width at parts where the via parts are connected to, an increase of a line width of the electrode patterns at the parts where the via parts are connected to corresponds to an offset amount of the via part with respect to the center of the electrode pattern, and a distance between the electrode patterns and the adjacent electrode patterns is reduced at the parts.

2. A semiconductor device comprising:
a capacitor including:
a first interconnection layer including a first electrode pattern and a second electrode pattern extended in a first direction;
a second interconnection layer including a third electrode pattern formed above the first electrode pattern and extended in the first direction and a fourth electrode pattern formed above the second electrode pattern and extended in the first direction;
a first via part formed between the first electrode pattern and the third electrode pattern, and electrically interconnecting the first electrode pattern and the third electrode pattern;
a second via part formed between the second electrode pattern and the fourth electrode pattern, and electrically interconnecting the second electrode pattern and the fourth electrode pattern;
an insulating film formed between the first interconnection layer, the second interconnection layer, the first via part and the second via part, wherein
the first via part is laid out, offset from a center of the first electrode pattern in a second direction intersecting the first direction, and
the third electrode pattern has a line width increased at a part where the first via part is connected to, an increase of a line width of the third electrode pattern at the part where the first via part is connected to corresponds to an offset amount of the first via part with respect to the center of the first electrode pattern, and a distance with respect to the fourth electrode pattern is reduced at the part.

3. The semiconductor device according to claim 2, comprising:
a plurality of the first via part, wherein
at least one of the plurality of the first via part is laid out, offset from the center of the first electrode pattern in the second direction; and
at least another one of the plurality of the first via part is laid out, offset from the center of the first electrode pattern in a third direction opposite to the second direction.

4. The semiconductor device according to claim 2, wherein the first interconnection layer further includes a first interconnection pattern,
the second interconnection layer further includes a second interconnection pattern electrically connected to the first interconnection pattern via a third via part, and
the third via part is laid out, not intentionally offset from the first interconnection pattern.

5. The semiconductor device according to claim 2, wherein the first interconnection layer further includes a first interconnection pattern,
the second interconnection layer further includes a second interconnection pattern electrically connected to the first interconnection pattern via a third via part, and
the offset amount of the first via part with respect to the center of the first electrode pattern is larger than an offset amount of the third via part with respect to the center of the first interconnection pattern.

6. The semiconductor device according to claim 2, wherein the second interconnection layer, the first via part and the second via part are integrally formed of the same conductive layer.

7. The semiconductor device according to claim 2, wherein the second via part is laid out, offset from a center of the second electrode pattern in the second direction.

8. The semiconductor device according to claim 7, comprising:
a plurality of the second via part, wherein
at least one of the plurality of the second via part is laid out, offset from the center of the second electrode pattern in the second direction; and
at least another one of the plurality of the second via part is laid out, offset from the center of the second electrode pattern in a third direction opposite to the second direction.

9. The semiconductor device according to claim 2, wherein the first via part and the second via part arranged in a direction parallel to the second direction are laid out, offset from the first electrode pattern and the second electrode pattern in the same direction.

* * * * *